United States Patent
Hirosaki

(10) Patent No.: US 7,544,310 B2
(45) Date of Patent: *Jun. 9, 2009

(54) FLUORESCENT SUBSTANCE

(75) Inventor: Naoto Hirosaki, Tsukuba (JP)

(73) Assignee: National Institute for Materials Science, Tsukuba-Shi, Ibaraki (JP)

( * ) Notice: Subject to any disclaimer, the term of this patent is extended or adjusted under 35 U.S.C. 154(b) by 368 days.

This patent is subject to a terminal disclaimer.

(21) Appl. No.: 10/564,439

(22) PCT Filed: Mar. 9, 2005

(86) PCT No.: PCT/JP2005/004596

§ 371 (c)(1),
(2), (4) Date: Jan. 12, 2006

(87) PCT Pub. No.: WO2005/087896

PCT Pub. Date: Sep. 22, 2005

(65) Prior Publication Data

US 2007/0108896 A1 May 17, 2007

(51) Int. Cl.
*C09K 11/59* (2006.01)
*C09K 11/64* (2006.01)
*C09K 11/08* (2006.01)

(52) U.S. Cl. .............................. 252/301.4 F; 313/503; 257/98

(58) Field of Classification Search ........... 252/301.4 F; 313/503; 257/98
See application file for complete search history.

(56) References Cited

U.S. PATENT DOCUMENTS 7,253,446 B2 * 8/2007 Sakuma et al. ............... 257/98

FOREIGN PATENT DOCUMENTS

| EP | 155047 | * | 9/1985 |
| JP | 60-206889 A | | 10/1985 |
| JP | 2003-124527 A | | 4/2003 |
| JP | 2003-336059 A | | 11/2003 |

* cited by examiner

*Primary Examiner*—C. Melissa Koslow
(74) *Attorney, Agent, or Firm*—Manabu Kanesaka

(57) ABSTRACT

A green fluorescent substance of the invention is higher in luminance of green than a conventional rare-earth activated sialon fluorescent substance and more excellent in durability than a conventional oxide fluorescent substance. The fluorescent substance is obtained by solid-dissolving Eu into a nitride or oxy-nitride crystal having a β-type $Si_3N_4$ crystal structure, and emits a fluorescent light having a peak within a range of 500 nm to 600 nm in wavelength by being irradiated with an excitation source.

14 Claims, 11 Drawing Sheets

FLUORESCENT SUBSTANCE

TECHNICAL FIELD

The present invention relates to a fluorescent substance having a β-type $Si_3N_4$ crystal structure, emitting a green fluorescent light having an emitted light peak between 500 nm and 600 nm in wavelength by being excited by an ultraviolet light or a visible light of 250 nm to 500nm in wavelength or an electron beam.

BACKGROUND ART

A fluorescent substance is used in a visual fluorescence display tube (VFD), a field emission display (FED), a plasma display panel (PDP), a cathode ray tube (CRT), a white light emitting diode (LED) and the like. In any of these uses, in order to make a fluorescent substance emit light, it is necessary to provide the fluorescent substance with energy for exciting the fluorescent substance, and a fluorescent substance emits a visible light by being excited by an excitation source having a high energy of a vacuum ultraviolet light, an ultraviolet light, an electron beam, a blue light and the like. However, as a result that a fluorescent substance is exposed to such an energy source as described above, the fluorescent substance is liable to be reduced in luminance and deteriorated in quality, and thus a fluorescent substance being less in reduction of luminance is demanded. Therefore, as a fluorescent substance less in reduction of luminance, a sialon fluorescent substance has been proposed instead of a conventional fluorescent substance such as a silicate fluorescent substance, a phosphate fluorescent substance, an aluminate fluorescent substance, a sulfide fluorescent substance or the like.

An example of such a sialon fluorescent substance is manufactured by a manufacturing process as roughly described below. It is manufactured by first mixing silicon nitride ($Si_3Ni_4$), aluminum nitride (AlN) and europium oxide ($Eu_2O_3$) together in a specified mole ratio, keeping the mixture at a temperature of 1700° C. in a nitrogen atmosphere of 1 atm. (0.1 MPa) for 1 hour, and burning it by means of a hot press method (see patent literature 1 for example). It has been reported that an a sialon having Eu ions activated which has been obtained by this process becomes a fluorescent substance emitting a yellow light of 550 to 600 nm by being excited by a blue light of 450 to 500 nm.

Further, there are known a blue light fluorescent substance having a JEM phase ($LaAl(Si_{6-z}Al_z)N_{10-z}O_z$) as a parent crystal and having Ce activated (see patent literature 2), a blue light fluorescent substance having $La_3Si_8N_{11}O_4$ as a parent crystal and having Ce activated (see patent literature 3), and a red light fluorescent substance having $CaAlSiN_3$ as a parent crystal and having Eu activated (see patent literature 4).

However, a fluorescent substance emitting a green light in addition to fluorescent substances emitting blue and yellow lights is also demanded for a white LED having an ultraviolet LED as an excitation source, a plasma display and the like.

REFERENCE LITERATURES

Patent literature 1; Japanese Patent Laid-Open Publication No. 2002-363,554

Patent literature 2; Japanese Patent Application No. 2003-208,409

Patent literature 3; Japanese Patent Application No. 2003-346,013

Patent literature 4; Japanese Patent Application No. 2003-394,855

As another sialon fluorescent substance, a fluorescent substance obtained by adding a rare earth element to a β-type sialon (see patent literature 5) is known, and it has been shown that such a fluorescent substance having Tb, Yb or Ag activated becomes a fluorescent substance emitting a green light of 525 nm to 545 nm. However, since an activated element remains in a grain boundary without being sufficiently solid-dissolved into a crystal due to its synthesizing temperature being as low as 1500° C., a high-luminance fluorescent substance has not been obtained.

Reference Literature

Patent literature 5; Japanese Patent Laid-Open Publication No. Sho 60-206,889

DISCLOSURE OF THE INVENTION

Problem the Invention Attempts to Solve

An object of the present invention is to meet such a demand and to provide a green fluorescent substance being higher in luminance of green than a conventional sialon fluorescent substance having a rare earth element activated and being more excellent in durability than a conventional oxide fluorescent substance.

MEANS FOR SOLVING THE PROBLEM

As a result of repeating earnestly research pertaining to nitrides containing elements such as Eu and Si, Al, O and N under such circumstances, the present inventors have found that a nitride having a particular range of compositions, a particular solid solution state and a particular crystal phase becomes a fluorescent substance having an emitted light peak within a range of 500 nm to 600 nm in wavelength. That is to say, the inventors have found that a solid solution crystal having nitride or oxy-nitride with a β-type $Si_3N_4$ crystal structure as a parent crystal and having divalent Eu ions added as a light emitting center becomes a fluorescent substance emitting light having a peak within a range of 500 nm to 600 nm in wavelength. The inventors have found that among others a β-type sialon synthesized at a temperature of 1820° C. or higher emits a green fluorescent light being good in color purity and having a peak within a range of 500 nm to 550 nm in wavelength thanks to a fact that Eu is solid-dissolved into a β-type sialon crystal.

A β-type $Si_3N_4$ crystal structure has the symmetry of $P6_3$ or $P6_3/m$ and is defined as a structure having an ideal atom position shown in Table 1 (see non-patent literature 1). As nitride or oxy-nitride having this crystal structure, there have known β-type $Si_3N_4$, β-type $Ge_3N_4$, β-type sialon ($Si_{6-z}Al_zN_{8-z}$, where $0 \leq z \leq 4.2$) and the like. And it is known that a β-type sialon solid-dissolves no metal element into its crystal at a synthesizing temperature of 1700° C. or lower and a metal oxide added as a sintering accelerator remains forming a glass phase in a grain boundary. In case of taking a metal element into a sialon crystal, an α-type sialon described in patent literature 1 is used. Table 1 shows crystal structure data on the basis of the atomic coordinates of β-type silicon nitride.

Reference Literature

Non-patent literature 1; Chong-Min Wang and four others, "Journal of Materials Science", Vol. 31, 1996, pp. 5281-5298

TABLE 1

Atomic coordinates of β-type $Si_3N_4$ crystal

| | x/a | y/a | z/c |
|---|---|---|---|
| Si: 6 (h) | 0.7686 | 0.1744 | 0.2500 |
| N1: 6 (h) | 0.0298 | 0.3294 | 0.2628 |
| N2: 2 (c) | 0.6667 | 0.3333 | 0.2392 |

Space group: $P6_3$
Lattice constant a = 0.7595 nm, c = 0.29023 nm
R. Grun, Acta Crystallogr. B35 (1979) 800

β-type $Si_3N_4$ and β-type sialon have been studied a heat-resistant material, and the description of solid-dissolving an optically active element into this crystal and using the solid-dissolved crystal as a fluorescent substance is simply related to investigation of particular elements in patent literature 5.

According to patent literature 5, as a fluorescent substance having an emitted light peak within a range of 500 nm to 600 nm in wavelength, only the case where Tb, Yb or Ag is added has been reported. However, a fluorescent substance having Tb added has an excitation wavelength of 300 nm or less, cannot be used in a white LED and is difficult to be applied to a display device due to an afterimage left because of its long light emitting life. And a fluorescent substance having Yb or Ag added has a problem of being low in luminance. Until the present invention has been reached after that, studies for using a crystal having a β-type $Si_3N_4$ structure as a fluorescent substance have not been performed.

That is to say, an important discovery that nitride or oxy-nitride having a β-type $Si_3N_4$ crystal structure having a particular metal element solid-dissolved into it can be used as a fluorescent substance emitting a high-luminance green light by being excited by ultraviolet rays, visible light, electron beam, or X rays has been performed for the first time by the present inventors. As a result of further repeating an earnest research on the basis of this knowledge, the present inventors have succeeded in providing a fluorescent substance exhibiting a high-luminance light emitting phenomenon in a particular range of wavelength, a method for manufacturing the same fluorescent substance, and an illuminator and an image display device having excellent characteristics by employing the means described in the following items (1) to (43). The means are as described in the following items (1) to (43).

(1) A fluorescent substance comprising a crystal of nitride or oxy-nitride having a β-type $Si_3N_4$ crystal structure having Eu solid-dissolved into it and emitting a fluorescent light having a peak within a range of 500 nm to 600 nm in wavelength by being irradiated with an excitation source.

(2) A fluorescent substance according to said item (1), wherein said crystal having a β-type $Si_3N_4$ crystal structure comprises a β-type sialon ($Si_{6-z}Al_zO_zN_{8-z}$, where $0 \leq z \leq 4.2$).

(3) A fluorescent substance according to said item (2), wherein the value of said z is "$0 \leq z \leq 0.5$".

(4) A fluorescent substance according to one of said items (1) to (3), wherein in case of representing Eu, A (where A is one, two or more kinds of elements selected from C, Si, Ge, Sn, B, Al, Ga and In) and X (where X is one or two kinds of elements selected from O and N) which are contained in said nitride or oxy-nitride crystal with a composition formula $Eu_aA_bX_c$ (where a+b+c=1), a, b and c in this formula meet the following relations (i) to (iii):

$$0.00001 \leq a \leq 0.1 \quad \text{(i)}$$

$$0.38 \leq b \leq 0.46 \quad \text{(ii)}$$

$$0.54 \leq c \leq 0.62 \quad \text{(iii)}$$

(5) A fluorescent substance according to one of said items (1) to (4), wherein in case of representing said nitride or oxy-nitride crystal with a composition formula $Eu_aSi_{b1}Al_{b2}O_{c1}N_{c2}$ (where $a+b_1+b_2+c_1+c_2=1$), a, $b_1$, $b_2$, $c_1$ and $c_2$ in this formula meet the following relations (i) to (v):

$$0.00001 \leq a \leq 0.1 \quad \text{(i)}$$

$$0.28 \leq b_1 \leq 0.46 \quad \text{(ii)}$$

$$0.001 \leq b_2 \leq 0.3 \quad \text{(iii)}$$

$$0.001 \leq c_1 \leq 0.3 \quad \text{(iv)}$$

$$0.4 \leq c_2 \leq 0.62 \quad \text{(v)}$$

(6) A fluorescent substance according to said item (5), wherein in said composition formula $Eu_aSi_{b1}Al_{b2}O_{c1}N_{c2}$, the relation between $b_1$ and $b_2$ and the relation between $c_1$ and $c_2$ respectively meet the following relations:

$$0.41 \leq b_1 + b_2 \leq 0.44$$

$$0.56 \leq c_1 + c_2 \leq 0.59$$

(7) A fluorescent substance according to one of said items (1) to (6), wherein said excitation source is an ultraviolet ray or a visible light of 100 nm to 500 nm in wavelength.

(8) A fluorescent substance according to said item (7), wherein said excitation source is a violet light or a blue light of 400 nm to 500 nm in wavelength.

(9) A fluorescent substance according to one of said items (1) to (6), wherein said excitation source is an electron beam or an X ray.

(10) A fluorescent substance according to one of said items (1) to (9), wherein said peak is within a range of 500 nm to 550 nm in wavelength.

(11) A fluorescent substance according to one of said items (1) to (10), wherein x and y of the value (x, y) on the CIE chromaticity coordinates of the color of light emitted at the time of being irradiated with said excitation source meet the following relations (i) and (ii):

$$0 \leq x \leq 0.3 \quad \text{(i)}$$

$$0.5 \leq y \leq 0.83 \quad \text{(ii)}$$

(12) A fluorescent substance according to one of said items (1) to (11), wherein said nitride or oxy-nitride crystal comprises a single crystal of 50 nm to 20 μm in average grain diameter.

(13) A fluorescent substance according to one of said items (1) to (12), wherein said nitride or oxy-nitride crystal is a single crystal of 1.5 to 20 in average aspect ratio.

(14) A fluorescent substance according to one of said items (1) to (13), wherein the total of impurity elements Fe, Co and Ni contained in said nitride or oxy-nitride crystal is not more than 500 ppm.

(15) A fluorescent substance according to one of said items (1) to (14), wherein said nitride or oxy-nitride crystal is formed as a mixture containing another crystalline or amorphous compound and the quantity of said nitride or oxy-nitride crystal contained in said mixture is 50 wt % (weight percents) or more.

(16) A fluorescent substance according to said item (15), wherein said another crystalline or amorphous compound is an electrically conductive inorganic compound.

(17) A fluorescent substance according to said item (16), wherein said electrically conductive inorganic compound is oxide, oxy-nitride, nitride or a mixture thereof containing one, two or more kinds of elements selected from Zn, Ga, In and Sn.

(18) A fluorescent substance manufacturing method for manufacturing a fluorescent substance according to one of said items (1) to (17), comprising a process of burning a raw material mixture at a temperature of 1820° C. to 2200° C. in a nitrogen atmosphere.

(19) A fluorescent substance manufacturing method according to said item (18), wherein said raw material mixture contains metal, oxide, carbonate, nitride, fluoride, chloride or oxy-nitride of Eu, and silicon nitride and aluminum nitride.

(20) A fluorescent substance manufacturing method according to said item (18) or (19), said nitrogen atmosphere in said process of burning is a nitrogen atmosphere within a pressure range of 0.1 MPa to 100 MPa.

(21) A fluorescent substance manufacturing method according to one of said items (18) to (20), further comprising a process of obtaining said raw material mixture by filling a container with a metal compound in the form of powder or aggregate as keeping said mixture at a filling factor of 40% or less in volume density before said process of burning.

(22) A fluorescent substance manufacturing method according to said item (21), wherein said container is made of boron nitride.

(23) A fluorescent substance manufacturing method according to said item (21) or (22), wherein said metal compound aggregate is 500 μm or less in average grain diameter.

(24) A fluorescent substance manufacturing method according to said item (23), further comprising a process of making said metal compound aggregate be 500 μm or less in average grain diameter by means of spray dryer, sieving or wind classification.

(25) A fluorescent substance manufacturing method according to one of said items (18) to (24), wherein said burning means is not a means using a hot press but a means using exclusively a normal pressure sintering method or a gas pressure burning method.

(26) A fluorescent substance manufacturing method according to one of said items (18) to (25), further comprising a process of grain-size-adjusting the burnt fluorescent substance so as to be powder of 50 nm to 20 μm in average grain diameter by one or plural means selected from grinding, classification and acid treatment.

(27) A fluorescent substance manufacturing method according to one of said items (18) to (26), further comprising a process of performing a heat treatment on a fluorescent substance after said burning process or after said grain size adjusting process at a temperature being not lower than 1000° C. and being lower than a burning temperature in said process of burning.

(28) A fluorescent substance manufacturing method according to one of said items (18) to (27), wherein said raw material mixture contains an inorganic compound forming a liquid phase at a temperature being not higher than the burning temperature in said process of burning.

(29) A fluorescent substance manufacturing method according to said item (28), wherein said inorganic compound forming a liquid phase at a temperature being not higher than said burning temperature comprises one or a mixture of two or more kinds of fluoride, chloride, iodide, bromide and phosphate of one, two or more kinds of elements selected from Li, Na, K, Mg, Ca, Sr and Ba.

(30) A fluorescent substance manufacturing method according to said item (29), wherein said inorganic compound forming a liquid phase at a temperature being not higher than said burning temperature is calcium fluoride.

(31) A fluorescent substance manufacturing method according to one of said items (28) to (30), wherein said raw material mixture contains an inorganic compound forming a liquid phase at a temperature being not higher than said burning temperature at the ratio of 0.1 to 10 in weight of said inorganic compound to 100 in weight of said raw material mixture.

(32) A fluorescent substance manufacturing method according to one of said items (28) to (31), further comprising a process of cleaning said burnt mixture with a solvent so as to reduce the quantity of said inorganic compound forming a liquid phase at a temperature being not higher than said burning temperature after said burning process.

(33) An illuminator comprising a light emitting light source and a fluorescent substance, wherein said fluorescent substance comprises a fluorescent substance according to one of said items (1) to (17).

(34) An illuminator according to said item (33), wherein said light emitting light source comprises at least one of a light emitting diode (LED), a laser diode (LD), an inorganic EL device and an organic EL device which emit light of 330 to 500 nm in wavelength.

(35) An illuminator according to said item (33) or (34), wherein said light emitting light source is a light emitting diode (LED) or a laser diode (LD) which emits light of 330 to 420 nm in wavelength, and said fluorescent substance comprises a blue fluorescent substance having a peak of emitted light within a range of 420 nm to 500 nm in wavelength, said light being emitted by an exciting light of 330 nm to 420 nm and a red fluorescent substance having a peak of emitted light within a range of 600 nm to 700 nm in wavelength, said light being emitted by an exciting light of 330 nm to 420 nm, and said illuminator emits white light by mixing blue light, green light and red light together.

(36) An illuminator according to said item (33) or (34), wherein said light emitting light source is a light emitting diode (LED) or a laser diode (LD) which emits light of 420 to 500 nm in wavelength, and said fluorescent substance comprises a red fluorescent substance having a peak of emitted light within a range of 600 nm to 700 nm in wavelength, said light being emitted by an exciting light of 420 to 500 nm, and said illuminator emits white light by mixing together blue light of said light emitting light source, and green light and red light emitted by said fluorescent substances.

(37) An illuminator according to one of said items (33) to (36), wherein said fluorescent substance comprises a yellow (or orange) fluorescent substance having a peak of emitted light within a range of 550 nm to 600 nm in wavelength, said light being emitted by an exciting light of 300 to 420 nm or 420 to 500 nm.

(38) An illuminator according to said item (33) or (34), wherein said light emitting light source is an LED or an LD which emits light of 420 to 500 nm in wavelength, and said fluorescent substance comprises a yellow (or orange) fluorescent substance having a peak of emitted light within a range of 550 nm to 600 nm in wavelength, said light being emitted by an exciting light of 420 to 500 nm, and said illuminator emits white light by mixing together blue light of said light emitting light source, and green light and yellow (or orange) light emitted by said fluorescent substances.

(39) An illuminator according to said item (37) or (38), wherein said yellow (or orange) fluorescent substance is Ca-α sialon having Eu solid-dissolved into it.

(40) An illuminator according to said item (36) or (38), wherein said red fluorescent substance comprises a fluorescent substance obtained by solid-dissolving Eu into an inorganic material having a $CaAlSiN_3$ type crystal structure.

(41) An illuminator according to said item (40), wherein said inorganic material having a $CaAlSiN_3$ type crystal structure is $CaAlSiN_3$.

(42) An image display device comprising an excitation source and a fluorescent substance, wherein said fluorescent substance comprises a fluorescent substance according to one of said items (1) to (17).

(43) An image display device according to said item (42), comprising at least one of a visual fluorescent display tube (VFD), a field emission display (FED), a plasma display panel (PDP) and a cathode ray tube (CRT).

Effect of the Invention

Thanks to containing as its main ingredient a solid solution of a crystal phase of nitride or oxy-nitride having a β-type $Si_3N_4$ crystal structure, a fluorescent substance of the present invention has a higher intensity of light emitted within a range of 500 nm to 600 nm in wavelength than a conventional sialon or oxy-nitride fluorescent substance and is more excellent as a green fluorescent substance. This fluorescent substance provides a nitride to be a useful fluorescent substance to be preferably used in VFD, FED, PDP, CRT, white LED and the like without being reduced in luminance even in case of being exposed to an excitation source.

BRIEF DESCRIPTION OF THE DRAWINGS

FIG. 3-1 shows a transmission electron microscope (TEM) image of the inorganic compound of embodiment 1.

FIG. 3-2 shows a transmission electron microscope (TEM) image of the inorganic compound of embodiment 1 in a high resolution.

FIG. 3-3 shows observed spectra of Eu in a grain by an electron beam energy loss analyzer (EELS) attached to TEM.

FIG. 4-1 shows emitted light spectrum showing a light emitting characteristic of the inorganic compound of embodiment 1.

FIG. 4-2 shows an image observed by a cathode luminescence detector (CL) of the inorganic compound of embodiment 1.

DESCRIPTION OF THE SYMBOLS

Figure 1:
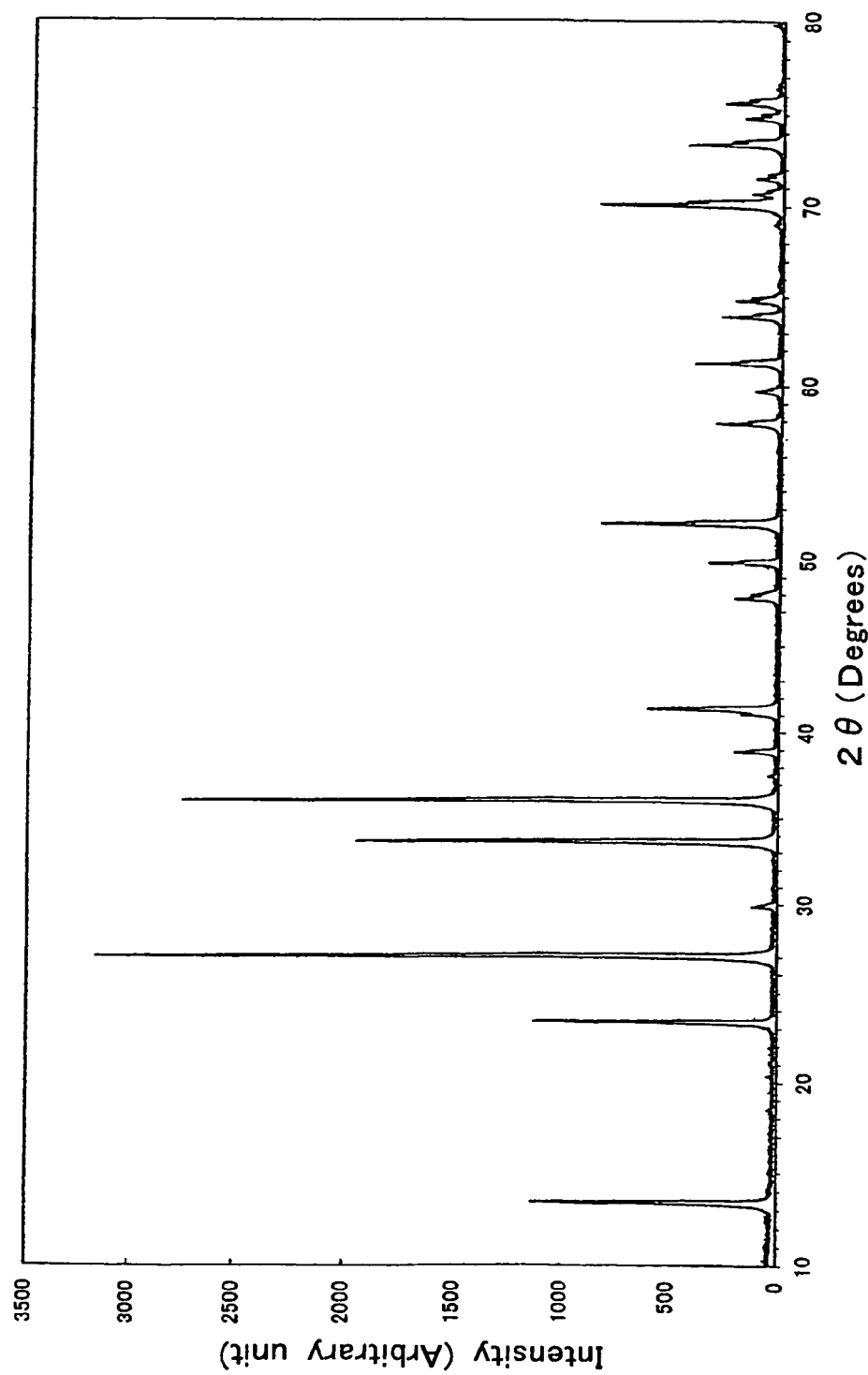
FIG. 1 shows an X-ray diffraction chart of an inorganic compound of embodiment 1.

1. A mixture of a green fluorescent substance (embodiment 1) of the present invention, a red fluorescent substance and a blue fluorescent substance, or a mixture of a green fluorescent substance (embodiment 1) of the present invention and a red fluorescent substance, or a mixture of a green fluorescent substance (embodiment 1) of the present invention and a yellow fluorescent substance.

2: LED chip, 3, 4: Conductive terminals, 5: Wire bond, 6: Resin layer, 7: Container, 8: Red fluorescent substance, 9: Green fluorescent substance, 10: Blue fluorescent substance, 11, 12, 13: Ultraviolet ray emitting cells, 14, 15, 16, 17: Electrodes, 18, 19: Dielectric layer, 20: Protective layer, 21, 22: Glass substrates

BEST MODE FOR CARRYING OUT THE INVENTION

Embodiments of the present invention are described in detail in the following.

A fluorescent substance of the present invention contains as its main ingredient a solid solution of a crystal phase of nitride or oxy-nitride having a β-type $Si_3N_4$ crystal structure (hereinafter, referred to as a β-type $Si_3N_4$ group crystal). A β-type $Si_3N_4$ group crystal can be identified by an X-ray diffraction or a neutron flux diffraction, and in addition to a substance exhibiting the same diffraction as a pure β-type $Si_3N_4$, a substance whose lattice constant is varied due to replacement of a component element of it with another element is also included in the β-type $Si_3N_4$ group crystal. Further, depending on the form of solid solution, a point defect, a plane defect or a stacking fault is introduced in a crystal and a solid-dissolved element may be concentrated in a defective part in a grain, but a substance in which the form of a chart obtained by an X-ray diffraction is not varied is a β-type $Si_3N_4$ group crystal. And a substance having a β-type $Si_3N_4$ crystal structure as its basic structure also in case of forming a polytype having a long-periodic structure due to a periodicity of formation of defects is a β-type $Si_3N_4$ group crystal.

Hereupon, a pure β-type $Si_3N_4$ crystal structure belongs to a hexagonal system having the symmetry of $P6_3$ or $P6_3/m$, and is a crystal defined as a structure having an ideal atom position of Table 1 (see non-patent literature 1). In an actual crystal, the position of each atom is varied by a degree of ±0.05 from its ideal position according to the kind of each atom occupying its position.

Although a=0.7595 nm and c=0.29023 nm for its lattice constant, the lattice constant is varied by a fact that Si being a component of it is replaced with another element such as Al or the like, or N is replaced with another element such as O or the like, or a metal element such as Eu or the like is solid-dissolved, but its crystal structure, a site occupied by the atom and the atom position given by its coordinates are not greatly varied. Therefore, if a lattice constant and a face index of a pure β-type $Si_3N_4$ are given, the position of a diffraction peak (2θ) by an X-ray diffraction is uniquely determined. And when a lattice constant calculated from the result of an X-ray diffraction measured for a new substance and data of a peak position of diffraction (2θ) calculated using a face index of Table 4 coincide with each other, it is possible to identify that the said crystal structures are the same as each other.

As a nitride or oxy-nitride crystal having a β-type $Si_3N_4$ crystal structure, there can be mentioned β-type $Si_3N_4$, β-type $Ge_3N_4$, β-type $C_3N_4$ and a solid solution thereof, without specifying a particular substance having the same crystal structure as a nitride or oxy-nitride crystal having a β-type $Si_3N_4$ crystal structure. As a solid solution, in the position of Si of a β-type $Si_3N_4$ crystal structure, Si can be replaced with an element such as C, Si, Ge, Sn, B, Al, Ga or In, and in the position of N, N can be replaced with an element such as O or N. The replacement of these elements includes a simultaneous replacement of not only one kind but also two or more kinds of elements. It is β-type $Si_3N_4$ and β-type sialon ($Si_{6-z}Al_zO_zN_{8-z}$, where 0<z<4.2) that provides a particularly high luminance among these crystals.

In the present invention, it is desirable that a crystal phase of nitride or oxy-nitride having a β-type $Si_3N_4$ crystal structure as its main ingredient is contained as much as possible at a high purity and is formed out of a single phase if possible, but can be composed of a mixture with another crystal phase or amorphous phase within a range in which its characteristics do not degrade. In this case, in order to obtain a high luminance, it is desired that the amount of contained crystal phase of nitride or oxy-nitride having a β-type $Si_3N_4$ crystal structure is 50 wt % or more. The range of a main ingredient in the present invention is at least 50 wt % or more in content amount of a crystal phase of nitride or oxy-nitride having a β-type $Si_3N_4$ crystal structure.

Bivalent Eu ions act as the center of light emission and exhibit the fluorescent characteristics by using a crystal of nitride or oxy-nitride having a β-type $Si_3N_4$ crystal structure as a parent crystal and solid-dissolving a metal element Eu into the parent crystal. Further, a β-type sialon crystal containing Eu, namely, a crystal containing Al and Eu in it is excellent in light emitting characteristic of green light in particular.

A fluorescent substance of the present invention emits a fluorescent light having a peak within a range of 500 nm to 600 nm in wavelength by being irradiated with an excitation source. An emitted light spectrum having a peak within this range emits a green light. Among others, the color of emitted light in a spectrum of a sharp shape having a peak within a range of 500 nm to 550 nm in wavelength is a green color which takes the values of "0≦x≦0.3 and 0.5≦y≦0.83" in terms of the value (x, y) on the CIE chromaticity coordinates and is good in color purity.

As an excitation source of the fluorescent substance, the use of light of 100 nm to 500 nm in wavelength (vacuum ultraviolet ray, deep ultraviolet ray, ultraviolet ray, near ultraviolet ray, violet to blue visible light), an electron beam, X rays and the like emits a high-luminance fluorescent light.

In the present invention, a crystal of nitride or oxy-nitride having a β-type $Si_3N_4$ crystal structure is not particularly specified in kind of its composition, but a fluorescent substance being high in content ratio of a crystal of nitride or oxy-nitride having a β-type $Si_3N_4$ crystal structure and being high in luminance can be obtained by the following composition.

As composition by which a fluorescent substance being high in content ratio of a crystal of nitride or oxy-nitride having a β-type $Si_3N_4$ crystal structure and being high in luminance can be obtained, the composition within the following range is preferable. The composition contains Eu, A (where A is an element C, Si, Ge, Sn, B, Al, Ga or In) and X (where X is one or two kinds of elements selected from O and N), and is represented by a composition formula $Eu_aA_bX_c$ (where a+b+c=1), where the values of a, b and c are selected from the values meeting all of the following conditions (i) to (iii):

$$0.00001 \leq a \leq 0.1 \quad \text{(i)}$$

$$0.38 \leq b \leq 0.46 \quad \text{(ii)}$$

$$0.54 \leq c \leq 0.62 \quad \text{(iii)}$$

"a" represents the amount of addition of element Eu to be the light emitting center, and is preferably not less than 0.00001 and not more than 0.1 at atom ratio. Since the number of Eu atoms to be the light emitting center is small when value a is less than 0.00001, the luminance of emitted light is lowered. When value a is more than 0.1, the luminance is lowered due to the density extinction caused by interference between Eu ions.

"b" is the amount of metal element forming a parent crystal and is preferably not less than 0.38 and not more than 0.46 at atom ratio. Preferably b=0.429. When value b is out of this range, the bond in a crystal becomes unstable and the ratio of formation of crystal phases other than a β-type $Si_3N_4$ crystal structure is increased and thereby the intensity of emitted green light is lowered.

"c" is the amount of non-metal elements forming the parent crystal and is preferably not less than 0.54 and not more than 0.62 at atom ratio. Preferably c=0.571. When value c is out of this range, the bond in a crystal becomes unstable and the ratio of formation of crystal phases other than a β-type $Si_3N_4$ crystal structure is increased and thereby the intensity of emitted green light is lowered.

In case of taking a β-type sialon as a parent crystal and using Eu as a light emitting center, a fluorescent substance being particularly high in luminance can be obtained by the following composition. The composition is represented by $Eu_aSi_{b1}Al_{b2}O_{c1}N_{c2}$ (where $a+b_1+b_2+c_1+c_2=1$), and a, $b_1$, $b_2$, $c_1$ and $c_2$ are selected from the values meeting all of the following conditions (i) to (v):

$$0.00001 \leq a \leq 0.1 \quad \text{(i)}$$

$$0.28 \leq b_1 \leq 0.46 \quad \text{(ii)}$$

$$0.001 \leq b_2 \leq 0.3 \quad \text{(iii)}$$

$0.001 \leq c_1 \leq 0.3$ (iv)

$0.44 \leq c_2 \leq 0.62$ (v)

"$b_1$" is the amount of Si, and is preferably not less than 0.28 and not more than 0.46 at atom ratio. "$b_2$" is the amount of Al, and is preferably not less than 0.001 and not more than 0.3 at atom ratio. And the total of values $b_1$ and $b_2$ is preferably not less than 0.41 and not more than 0.44, and more preferably is 0.429. When values $b_1$ and $b_2$ are out of this range, the ratio of formation of crystal phases other than a β-type sialon is increased and thereby the intensity of emitted green light is lowered.

"$c_1$" is the amount of oxygen, and is preferably not less than 0.001 and not more than 0.3 at atom ratio. "$c_2$" is the amount of nitrogen, and is preferably not less than 0.54 and not more than 0.62 at atom ratio. And the total of values $c_1$ and $c_2$ is preferably not less than 0.56 and not more than 0.59. More preferably c=0.571. When values $c_1$ and $c_2$ are out of this range, the ratio of formation of crystal phases other than β-type sialon is increased and thereby the intensity of emitted green light is lowered.

And these compositions may contain other elements as impurities in a range in which the characteristics are not deteriorated. Impurities deteriorating the light emitting characteristics are Fe, Co, Ni and the like, and when the total of these three elements exceeds 500 ppm, the luminance of emitted light is lowered.

In the present invention, it is desired that a crystal phase is formed out of a single phase of a crystal phase of nitride or oxy-nitride having a β-type $Si_3N_4$ crystal structure, but it can be also formed out of a mixture with another crystal phase or amorphous phase within a range in which the characteristics are not deteriorated. In this case, in order to obtain a high luminance, it is desired that the amount of contained crystal phase of nitride or oxy-nitride having a β-type $Si_3N_4$ crystal structure is 50 wt % or more.

The range of a main ingredient in the present invention is at least 50 wt % or more in content amount of a crystal phase of nitride or oxy-nitride having a β-type $Si_3N_4$ crystal structure. The ratio of content amount can be obtained by performing an X-ray diffraction measurement and comparing with each other the intensities of the respective most intense peaks of a crystal phase of nitride or oxy-nitride having a β-type $Si_3N_4$ crystal structure and crystal phases other than it.

A fluorescent substance formed out of a mixture with another crystal phase or amorphous phase can be mixed with an electrically conductive inorganic substance. In case of exciting a fluorescent substance of the present invention with an electron beam in VFD, PDP and the like, it is preferable that the fluorescent substance has some conductivity in order to discharge electrons to the outside without making the electrons stay on the fluorescent substance.

As electrically conductive materials there can be mentioned oxide, oxy-nitride, nitride or a mixture thereof containing one, two or more kinds of elements selected from Zn, Ga, In and Sn. Among others, indium oxide and indium-tin oxide (ITO) are more preferable since they are less in reduction of intensity of fluorescence and higher in conductivity.

Although the form of a fluorescent substance of the present invention is not specified in particular, in case that it is used as powder, it is preferably a single crystal of 50 nm to 20 μm in average grain diameter in order to obtain a high luminance. Furthermore, a single crystal of 1.5 to 20 in average aspect ratio (the value of the length of the major axis of a grain divided by the length of the minor axis) provides a further higher luminance. An average grain diameter larger than 20 μm is not preferable due to making the fluorescent substance poor in dispersiveness in being used in an illuminator or an image display device.

Fluorescent substance powder being smaller in average grain diameter than 50 nm becomes poor in operability due to aggregation of powder. A single crystal grain of 1.5 or more in average aspect ratio (the value of the length of the major axis of a grain divided by the length of the minor axis) provides a particularly high-luminance light. This incorporates a relatively more amount of metal elements such as Eu and the like into a crystal having β-type silicon nitride structure when the crystal grows, and provides a high-luminance light due to a small amount of defects hindering the fluorescence and due to a relatively high transparency. However, an aspect ratio higher than 20 is not preferable from the viewpoint of environment due to making needle crystals. In such a case it is enough to grind the needle crystals by a manufacturing method of the present invention.

A method for manufacturing a fluorescent substance of the present invention is not specified in particular, but the following method can be mentioned as an example.

A raw material mixture which is a mixture of metal compounds and can form composition $EU_aSi_bAl_cO_dN_e$ by burning is burned in a nitrogen atmosphere. Since the optimal burning temperature is different depending on the composition, it can be unconditionally prescribed, but generally a green fluorescent substance can be stably obtained within a temperature range of 1820° C. to 2200° C. At a burning temperature being lower than 1820° C., since element Eu to be a light emitting center remains in a grain boundary containing much oxygen without being solid-dissolved into a nitride or oxy-nitride crystal having a β-type $Si_3N_4$ crystal structure, the result provides a light emission having oxide glass as a host to emit a low-wavelength light such as blue or the like without providing a green fluorescent light. According to patent literature 5, the burning temperature is 1550° C. and Eu remains in a grain boundary. That is to say, in patent literature 5, even in case of using the same Eu as an active element, the wavelength of emitted light is blue between 410 and 440 nm and is essentially different from the wavelength between 500 and 550 nm of light emitted by a fluorescent substance of the present invention. And a burning temperature being not lower than 2200° C. requires a special apparatus and therefore is not preferable industrially.

A mixture of metal compounds may be preferably a mixture formed out of an Eu containing metal compound selected from metal, oxide, carbonate, nitride or oxy-nitride of Eu, and silicon nitride and aluminum nitride. These have an advantage of being produced as industrial raw materials and easy to obtain in addition to being excellent in reactivity and being able to provide a high-purity compound.

In order to improve the reactivity during a burning process, it is possible to add an inorganic compound forming a liquid phase at a temperature being not higher than the burning temperature to a mixture of metal compounds according to need. As the inorganic compound, a compound forming a stable liquid phase at a reaction temperature is preferable, and fluoride, chloride, iodide, bromide or phosphate of such an element as Li, Na, K, Mg, Ca, Sr or Ba is suitable.

Further, these inorganic compounds each may be added singly and may be added as a mixture of two or more kinds of the compounds. Among others, calcium fluoride is suitable due to being high in ability to improve the reactivity in synthesis. Although the amount of addition of inorganic compounds is not prescribed in particular, the ratio of 0.1 to 10 in weight of inorganic compound to 100 in weight of a metal compound being a starting raw material provides a particularly large effect.

Being smaller than 0.1 in weight is less in improvement of the reactivity and exceeding 10 in weight lowers the luminance of a fluorescent substance. To add and burn these inorganic compounds improves the reactivity, grows a single crystal being large in grain diameter by promoting growth of grains in a comparatively short time, and improves the luminance of a fluorescent substance. Further, reducing the amount of inorganic compounds contained in a reactant obtained by burning by cleaning the burnt mixture with a solvent to solve the inorganic compounds after burning improves the luminance of the fluorescent substance. As such a solvent, there can be mentioned water, ethanol, sulfuric acid, hydrofluoric acid and a mixture of sulfuric acid and hydrofluoric acid.

The nitrogen atmosphere is preferably a gas atmosphere within a pressure range of 0.1 MPa to 100 MPa. More preferably it is not lower than 0.5 MPa and not higher than 10 MPa. In case of using a silicon nitride as a raw material, when heating to a temperature of 1820° C. or higher, a nitrogen atmosphere being lower than 0.1 MPa is not preferable since the raw material is thermally decomposed. When it is higher than 0.5 MPa, the raw material is hardly decomposed. A pressure of 10 MPa is enough, but a pressure of 100 MPa or higher requires a special apparatus and is not suitable for industrial production.

According to a method of filling a container with a metal compound in the form of powder or aggregate as keeping the metal compound at a filling factor of 40% or less in volume density and then burning the metal compound, a particularly high luminance can be obtained. In case of using fine powder of several microns in grain diameter as a starting raw material, a mixture of metal compounds which have passed a mixing process makes a form in which fine powder of several microns in grain diameter aggregates into the size of several hundred microns to several millimeters (referred to as a powder aggregate). The present invention burns a powder aggregate in a state of keeping it at a filling factor of 40% or less in volume density.

That is to say, while a conventional sialon manufacturing method performs a burning process at a high filling factor of powder after a hot press or metal-mold molding, the present invention fills a container with a mixture of powder aggregate being uniform in grain size as it is at a filling factor of 40% or less in volume density without molding the powder aggregate by means of metal molds or the like in advance. According to need, it can control the said powder aggregate in grain size by making grains be 500 μm or less in average grain diameter by means of sieving or wind classification. And the powder aggregate may be directly made into grains of 500 μm or less by means of a spray dryer and the like. And a container made of boron nitride has an advantage of being less reactive with a fluorescent substance.

The reason why a burning process is performed as keeping a filling factor of 40% or less in volume density is that when a burning process is performed in a state where a free space exists around raw material powder, crystals come into less contact with one another due to a fact that reaction products grow into crystal in the free space, and a crystal being less in surface defect can be synthesized. Thanks to this, a high-luminance fluorescent substance can be obtained. A volume density of 40% or more generates densification partially during a burning process, results in forming a dense sinter to hinder the growth of crystal and lowers the luminance of a fluorescent substance. And fine powder cannot be obtained.

And the size of powder aggregate is particularly preferable to be 500 μm or less due to being excellent in grindability after burning.

Next, powder aggregate being 40% or less in filling factor is burned under the above-mentioned condition. Since a burning temperature is high and a burning atmosphere is nitrogen, a furnace to be used in a burning process is preferably an electric furnace of a metal resistance heating type or a graphite resistance heating type using carbon as a material for a high-temperature portion of the furnace. A burning method is preferably a sintering method such as a normal pressure sintering method, a gas pressure sintering method and the like which apply no mechanical pressure from the outside due to burning as keeping the volume density high.

In case that a powder aggregate obtained by burning is firmly hardened, the powder aggregate is ground by such a grinder usually used in a factory as a ball mill, a jet mill or the like, for example. Among others, ball-mill grinding makes it easy to control grain size. A ball and a pot used at this time are preferably made of a silicon nitride sinter or a sialon sinter. More preferably, they are made of ceramic sinter having the same composition as a fluorescent substance to be a product. A grinding process is performed until the average grain size becomes 20 μm or less. More preferably the average grain size is not less than 20 nm and not more than 5 μm. When the average grain size exceeds 20 μm, the flowability and the dispersibility of powder in resin is made bad, and when forming a light emitting apparatus in combination with a light emitting device, the intensity of luminance is made uneven depending on parts. The average grain size of 20 nm or less makes the operability of handling the powder poor. In case of being unable to obtain a desired grain size by only grinding, it is possible to combine grinding with classification. As a method of classification, a sieving method, a wind classification method, an in-liquid precipitation method or the like can be used.

An acid treatment may be performed as one method of grinding classification. In many cases, a powder aggregate obtained by burning is in a state where single crystals of nitride or oxy-nitride having a β-type $Si_3N_4$ crystal structure are firmly hardened in a grain boundary phase having a minute amount of glass phase as its main component. In this case, when the powder aggregate is immersed in an acid having a specific composition, a grain boundary phase having a glass phase as its main component is selectively dissolved and single crystals are separated. Due to this, each grain is obtained not as aggregate of single crystals but as a grain composed of a single crystal of nitride or oxy-nitride having a β-type $Si_3N_4$ crystal structure. Such a grain provides a fluorescent substance being particularly high in luminance due to being composed of a single crystal having less surface defects.

As acid being effective for this treatment, there can be mentioned hydrofluoric acid, sulfuric acid, hydrochloric acid, and a mixture of hydrofluoric acid and sulfuric acid. Among others, a mixture of hydrofluoric acid and sulfuric acid is high in effect of removing a glass phase.

Although fine powder of a fluorescent substance is obtained by the above process, a heat treatment is effective in order to further improve the luminance. In this case, powder after burning or powder after being adjusted in grain size by grinding or classification can be heat-treated at a temperature being not lower than 1000° C. and being not higher than a burning temperature. A temperature being lower than 1000° C. reduces an effect of removing surface defects. A temperature being not lower than the burning temperature is not preferable due to a fact that ground powder is hardened again.

An atmosphere suitable for heat treatment varies according to the composition of a fluorescent substance, but a mixed atmosphere of one kind or two or more kinds selected from nitrogen, air, ammonia and hydrogen can be used, and particularly a nitrogen atmosphere is preferable due to being excellent in effect of removing defects.

A nitride of the present invention obtained as described above is characterized in having a broader excitation range from ultraviolet rays to visible light in comparison with a conventional oxide fluorescent substance or an existing sialon fluorescent substance and in emitting a green light having a peak within a range of 500 nm to 600 nm, and is suitable for an illuminator and an image display device. In addition to this, it is excellent in thermal resistance due to being not deteriorated even by being exposed to a high temperature and is also excellent in stability for a long period under an oxidizing atmosphere and a moisture environment.

An illuminator of the present invention is composed of at least a light emitting light source and a fluorescent substance of the present invention. As an illuminator, there are an LED illuminator, a fluorescent lamp, an EL illuminator and the like. An LED illuminator can be manufactured using a fluorescent substance of the present invention by means of a publicly known method as described in Japanese Patent Laid-Open Publication No. Hei 5-152,609, Japanese Patent Laid-Open Publication No. Hei 7-99,345, Japanese Patent Publication No. 2,927,279 and the like. In this case, a light emitting light source is preferably a light source emitting light of 330 to 500 nm in wavelength, and among others, an ultraviolet (or violet) LED light emitting device or LD light emitting device of 330 to 420 nm and a blue LED or LD light emitting device of 420 to 500 nm are preferable.

Some of these light emitting devices is made of a nitride semiconductor such as GaN, InGaN or the like, and can become a light emitting light source emitting light of specified wavelength by adjusting the composition of it.

It is possible to form an illuminator emitting light having a desired color by using singly a fluorescent substance of the present invention in an illuminator and additionally to this method, using jointly a fluorescent substance having another light emitting characteristic. As an example of this, there is a combination of an ultraviolet LED or LD light emitting device of 330 to 420 nm, a blue fluorescent substance having a light emitting peak between 420 nm and 500 nm in wavelength by being excited by this wavelength, a red fluorescent substance having an emitted light peak between 600 nm and 700 nm in wavelength and a green fluorescent substance of the present invention. There can be mentioned $BaMgAl_{10}O_{17}$:Eu as such a blue fluorescent substance and $CaSiAlN_3$:Eu described in Japanese Patent Application No. 2003-394,855 as a red fluorescent substance. In this composition, when fluorescent substances are irradiated with an ultraviolet ray emitted by an LED or LD, lights of three colors of red, green and blue are emitted and a white illuminator is made by mixture of these colors.

As another technique, there is a combination of a blue LED or LD light emitting device of 420 to 500 nm, a red fluorescent substance having a light emitting peak between 600 nm and 700 nm by being excited by this wavelength and a fluorescent substance of the present invention. There can be mentioned $CaSiAlN_3$:Eu described in Japanese Patent Application No. 2003-394,855 as such a red fluorescent substance. In this composition, when a fluorescent substance is irradiated with a blue light emitted by an LED or LD, lights of two colors of red and green are emitted and a white or reddish electric-lamp colored illuminator is made by mixture of these and a blue light of the LED or LD itself.

As another technique, there is a combination of a blue LED or LD of 420 to 500 nm, a yellow or orange fluorescent substance having a light emitting peak between 550 nm and 600 nm by being excited by this wavelength and a fluorescent substance of the present invention. There can be mentioned $(Y, Gd)_2(Al, Ca)_5O_{12}$: Ce described in Japanese Patent Laid-Open Publication No. Hei 9-218,149 or α-sialon:Eu described in Japanese Patent Laid-Open Publication No. 2002-363,554 as such a yellow or orange fluorescent substance. Among others, Ca-α-sialon having Eu solid-dissolved into it is preferable due to its high luminance of emitted light. In this composition, when a fluorescent substance is irradiated with a blue light emitted by an LED or LD, lights of two colors of yellow or orange and green are emitted and a white illuminator is made by mixture of these and a blue light of the LED or LD itself. And it is possible to adjust the color of light of an illuminator into various colors such as bluish white, white and reddish electric-lamp color by changing the ratio of two kinds of fluorescent substances to be combined.

An image display device of the present invention is composed of at least an excitation source and a fluorescent substance of the present invention, and includes a visual fluorescent display tube (VFD), a field emission display device (FED), a plasma display panel (PDP), a cathode ray tube (CRT) and the like. It has been confirmed that a fluorescent substance of the present invention emits light by excitation of a vacuum ultraviolet ray of 100 to 190 nm, an ultraviolet ray of 190 to 380 nm, an electron beam and the like, and an image display device as described above can be composed by a combination of these excitation sources and a fluorescent substance of the present invention.

Next, the present invention is described in more detail on the basis on embodiments shown in the following, but these are disclosed only as an aid to easily understand the present invention and the present invention is not limited to these embodiments.

Embodiment 1

As raw material powder, there were used silicon nitride powder being 0.5 μm in average grain size and containing oxygen of 0.93 wt % and α-type of 92%, aluminum nitride powder being 3.3 $m^2$/g in specific surface area and containing oxygen of 0.79% and europium oxide powder of 99.9% in purity.

In order to obtain a compound shown by a composition formula $Eu_{0.00296}Si_{0.41395}Al_{0.01334}O_{0.00444}N_{0.56528}$ (Designed composition is shown in Table 2, and mixture composition and burning temperature of the raw material powder are shown in Table 3), the silicon nitride powder, the aluminum nitride powder and the europium oxide powder were weighed so that they were respectively 94.7 wt %, 2.68 wt % and 2.556 wt %, and were mixed for 2 hours by a wet ball mill using a pot made of silicon nitride sinter, balls made of silicon nitride sinter and n-hexane.

Dried mixture powder was obtained by removing n-hexane by means of a rotary evaporator. A powder aggregate being excellent in flowability was obtained by grinding the obtained mixture by means of an agate mortar and pestle and then passing the ground mixture through a sieve of 500 μm. When this powder aggregate was put into a crucible made of boron nitride of 20 mm in diameter and 20 mm in height by natural falling, the volume density of 30 vol % was obtained. The volume density was calculated from the weight of the powder aggregate put into and the capacity of the crucible.

Next, the crucible was set on an electric furnace of a graphite resistance heating type. A burning process first made a burning atmosphere vacuum using a diffusion pump, heated the crucible at heating rate of 500° C./hour from room temperature to 800° C., introduced nitrogen of 99.999 vol % in purity at 800° C. to make 1 MPa in pressure, heated the crucible to 1900° C. at a heating rate of 500° C./hour, and kept it at 1900° C. for 8 hours.

The synthesized sample was ground by means of the agate mortar and a powder X-ray diffraction measurement (XRD) using Kα-rays of Cu was performed. A chart obtained as a result showed a pattern shown in FIG. 1, from which it was found by a composition analysis that a β-type sialon having a β-type silicon nitride structure and containing Al and O was generated. This burnt object obtained was roughly ground and then was ground by means of a mortar and pestle made of silicon nitride. When the grain size distribution was measured, the average grain size of 4 μm was obtained.

The composition analysis of this powder was performed by the following method. First, this method put a sample of 50 mg into a platinum crucible, added sodium carbonate of 0.5 g and boric acid of 0.2 g to the sample, heated and melted the sample and then dissolved the sample into hydrochloric acid of 2 ml to make a solution for measurement having a constant volume of 100 ml. The method quantified the quantities of Si, Al, Eu and Ca in the powder sample by performing an ICP light emission spectroscopic analysis on this liquid sample. And the method put the sample of 20 mg into a tin capsule and quantified oxygen and nitrogen in the powder sample by measuring this capsule put into a nickel basket by means of an oxygen and nitrogen analyzer of Model TC-436 made by LECO, Inc.

Further, in order to quantify the amount of impurities being a minute amount of components in the powder, the method quantified the amounts of impurities B, Fe, Ca, Mg, Al and Cr by mixing and cramming the sample of 50 mg and graphite powder of 50 mg into a graphite electrode and using a CID-DCA light emission spectroscopic analysis apparatus made by Japan Jarel-Ash Co. The measurement by the ICP light emission spectroscopic analysis and the oxygen and nitrogen analyzer provided the result that Eu of 2.16±0.02 wt %, Si of 55.6±0.1 wt %, Al of 1.64±0.1 wt %, N of 38.0±0.1 wt %, and O of 2.1±0.1 wt %.

The composition (represented by the number of atoms) of the synthesized inorganic compound calculated from the result of analysis of all the elements is $Eu_{0.00290}Si_{0.40427}Al_{0.01210}O_{0.02679}N_{0.55391}$. This is particularly high in oxygen content in comparison with the designed composition ($Eu_{0.00296}Si_{0.41395}Al_{0.01334}O_{0.00444}N_{0.56528}$) shown in Table 2. This is caused by impurity oxygen contained in the silicon nitride and aluminum nitride used as raw materials. A sialon composition of the present invention is ideally a composition of $Si_{6-z}Al_zO_zN_{8-z}$ (where 0<z<4.2), but a composition in which part of N component in this composition is replaced with O falls also within the scope of the present invention, and in such a case also, a green fluorescent substance being high in luminance can be obtained.

And as impurity elements detected by the CID-DCA light emission spectroscopic analysis, there were Y of 0.009 wt %, B of 0.001 wt %, Fe of 0.003 wt %, Ca of 0.001 wt % or less, Mg of 0.001 wt % or less, and Cr of 0.001 wt % or less.

Figure 2:
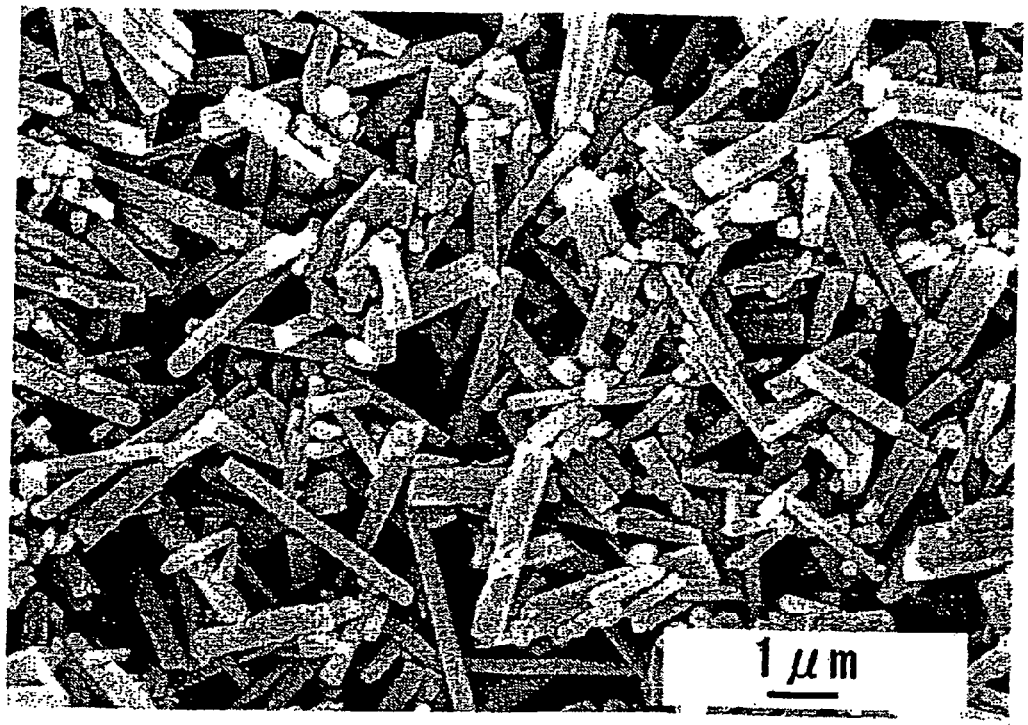
FIG. 2 shows a scanning electron microscope (SEM) image of the inorganic compound of embodiment 1.

The form of this powder was observed by means of a scanning electron microscope (SEM). As shown in FIG. 2, it was confirmed that the powder was composed of needle crystals each being about 100 to 500 nm in minor axis and about 4 μm in major axis. A crystal of such a form shows that it was crystal-grown through a gas phase or a liquid phase in a free space, and is essentially different from the synthesis at a low temperature of 1800° C. or lower.

Figures 1, 3:
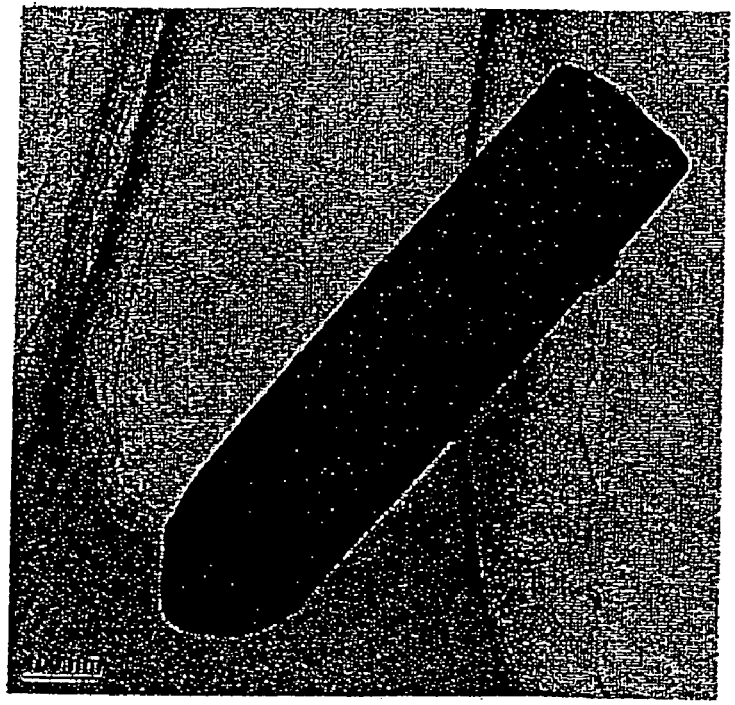
Figures 2, 3:
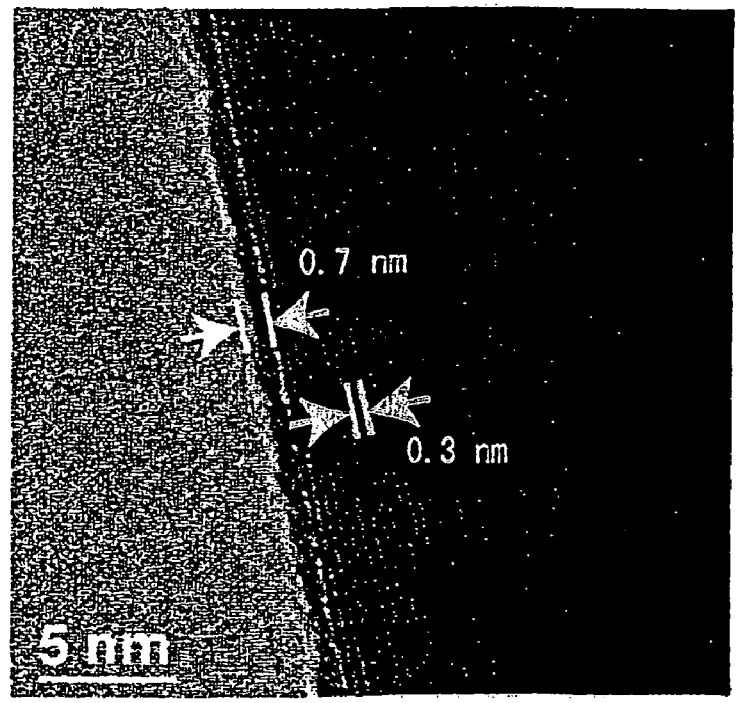
Figure 3:
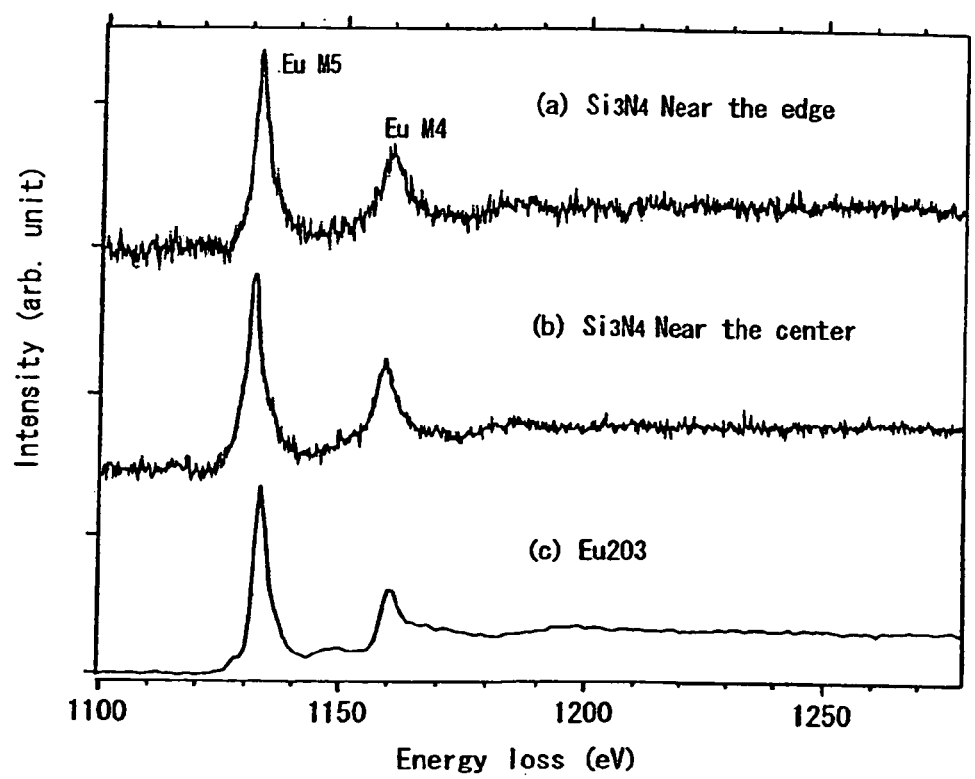

The form of this powder was observed by means of a transmission electron microscope (TEM) (FIGS. 3-1 and 3-2). As shown in FIG. 3-1, a grain is a single crystal having no grain boundary and is characterized in having little defects in the grain. And according to a high-resolution observation (FIG. 3-2), it has been confirmed that there is an amorphous phase of 0.7 nm on the surface of a single crystal grain but there are not another amorphous and crystal phase.

This amorphous phase is a silicon oxide made by oxidation of the surface of a grain. In order to examine the existence of Eu in this grain, spectra of Eu were measured using an electron beam energy loss analyzer (EELS) attached to the TEM (FIG. 3-3). It has been confirmed that the spectra showing the states of Eu electrons on the surface (chart (a) in FIG. 3-3) and in the middle (chart (b) in FIG. 3-3) of a grain are almost the same as each other and these are the same as the spectrum of europium oxide ($Eu_2O_3$); chart (c) in FIG. 3-3) being a reference sample. That is to say, it has been confirmed that Eu exists in a grain and is not unevenly distributed on an amorphous surface phase.

Figures 1, 4:
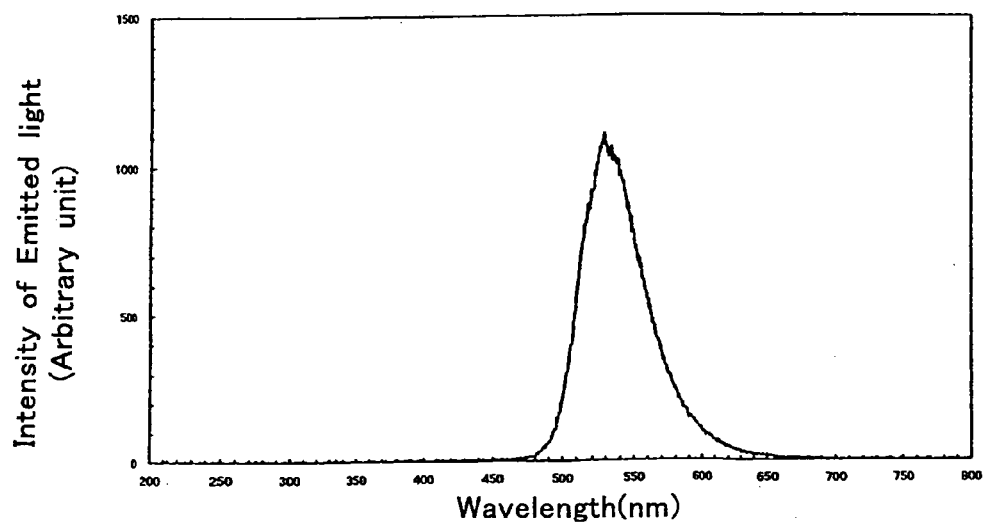
Figures 2, 4:

The uniformity of this powder was observed by an SEM provided with a cathode luminescence (CL) detector and a cathode luminescence image was evaluated. This apparatus irradiates a sample with an electron beam, detects a visible light generated thereby, acquires a photographic image being two-dimensional information and thereby clarifies at what place and of what wavelength light is emitted. By observing the spectrum of an emitted light of FIG. 4-1, it has been confirmed that this fluorescent substance emits a green light of 530 nm in wavelength through being excited by an electron beam. And according to a CL image having several ten grains observed (FIG. 4-2), it has been confirmed that a spot where a particular part emits light does not exist and the inside of a grain emits uniformly green light. And it has been confirmed that no grain emits a particularly intense light and all of the several ten grains uniformly emit green light.

The CL image shows that a part whitely observed is a part emitting light of 530 nm, and the whiter the black and white gradation display is the more intense a green light emitted is.

Integrating the results of observation of the XRD charts, SEM images, TEM images, EESL spectra and CL images shown above, the following facts have been confirmed for this powder:

(1) The powder is an inorganic substance having a β-type sialon of a β-type $Si_3N_4$ structure as its parent structure and having Eu solid-dissolved into it;

(2) Its composition is $Eu_{0.00290}Si_{0.40427}A_{0.01210}O_{0.02679}N_{0.55391}$;

(3) Eu is uniformly distributed in a β-type sialon crystal;

(4) The powder is a single phase substance not having other phases such as a second phase, a grain boundary phase and the like formed;

(5) Each grain is one single crystal; and (6) Each grain emits light uniformly.

A fluorescent having such characteristics has not been reported up to now and has been found for the first time by the present inventors.

Figure 5:
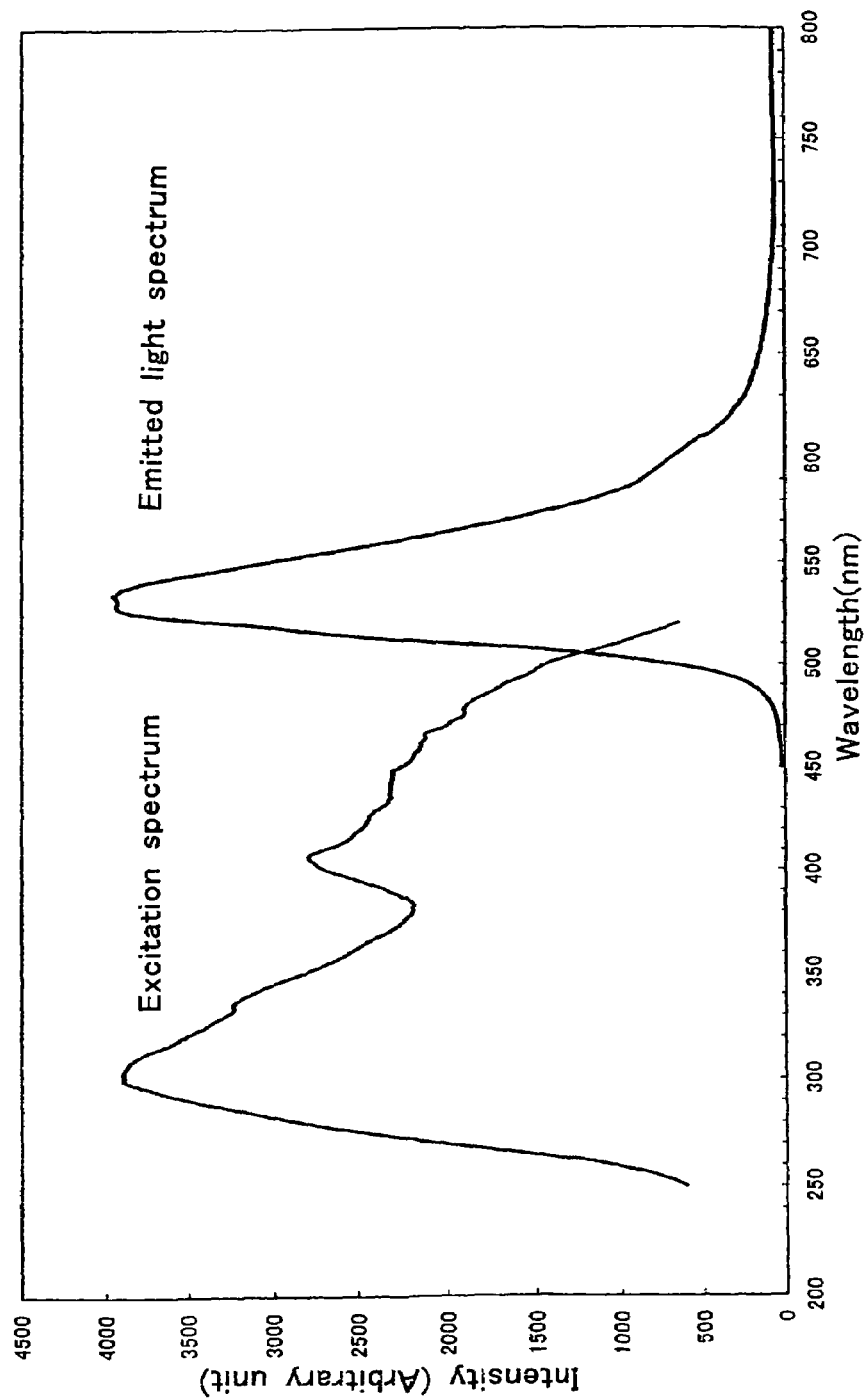
FIG. 5 shows an excitation spectrum and an emitted light spectrum of embodiment 1 obtained by fluorometry.

It has been confirmed that a green light is emitted as a result of irradiating this powder with light of 365 nm in wavelength emitted by a lamp. As a result of measuring the spectrum of emitted light of this powder and the spectrum of excitation (FIG. 5) by means of a fluorescent spectrophotometer, it has found that this powder is a fluorescent substance having an excitation spectrum peak at 303 nm and a green light peak at 535 nm in the spectrum of light emitted by excitation of 303 nm.

The intensity of emitted light at the peak was 3948 counts. The count value has an arbitrary unit as its unit due to varying according to measurement apparatus or measurement conditions. That is to say, count values can be compared with one another only in the embodiments and comparative examples measured under the same conditions. The CIE chromaticity of light emitted by excitation of 303 nm was a green color of "x=0.32, y=0.64".

Embodiments 2 to 24 were performed on the basis of a similar method and procedure to embodiment 1. Their designed compositions and the mixture compositions of raw material powder are shown collectively in Tables 2 and 3.

TABLE 2

Designed Composition

| | Designed composition (atom ratio) | | | | |
|---|---|---|---|---|---|
| | Eu | Si | Al | O | N |
| Embodiment | | | | | |
| 1 | 0.002966 | 0.413952 | 0.013348 | 0.004449 | 0.565284 |
| 2 | 0.001427 | 0.421541 | 0.006419 | 0.002140 | 0.568474 |
| 3 | 0.004415 | 0.419426 | 0.005151 | 0.006623 | 0.564386 |
| 4 | 0.001478 | 0.421286 | 0.006652 | 0.002217 | 0.568367 |
| 5 | 0.000444 | 0.421941 | 0.007180 | 0.000666 | 0.569768 |
| 6 | 0.009105 | 0.409712 | 0.010622 | 0.013657 | 0.556904 |
| 7 | 0.003063 | 0.413476 | 0.013783 | 0.004594 | 0.565084 |
| 8 | 0.000922 | 0.414810 | 0.014902 | 0.001383 | 0.567983 |
| 9 | 0.000308 | 0.415193 | 0.015224 | 0.000461 | 0.568814 |
| 10 | 0.019417 | 0.388350 | 0.022654 | 0.029126 | 0.540453 |
| 11 | 0.006601 | 0.396040 | 0.029703 | 0.009901 | 0.557756 |
| 12 | 0.001994 | 0.398804 | 0.032237 | 0.002991 | 0.563975 |
| 13 | 0.000666 | 0.399600 | 0.032967 | 0.000999 | 0.565768 |
| 14 | 0.001069 | 0.391808 | 0.035619 | 0.037222 | 0.534283 |
| 15 | 0.000357 | 0.392507 | 0.035682 | 0.036218 | 0.535236 |
| 16 | 0.001069 | 0.356189 | 0.071238 | 0.072841 | 0.498664 |
| 17 | 0.000357 | 0.356824 | 0.071365 | 0.071900 | 0.499554 |
| 18 | 0.000119 | 0.357037 | 0.071407 | 0.071586 | 0.499851 |
| 19 | 0.000119 | 0.285629 | 0.142815 | 0.142993 | 0.428444 |
| 20 | 0.000922 | 0.414810 | 0.014902 | 0.001383 | 0.567983 |
| 21 | 0.000922 | 0.414810 | 0.014902 | 0.001383 | 0.567983 |
| 22 | 0.000999 | 0.399401 | 0.032784 | 0.001498 | 0.565319 |
| 23 | 0.000999 | 0.399401 | 0.032784 | 0.001498 | 0.565319 |
| 24 | 0.001089 | 0.381194 | 0.053912 | 0.001634 | 0.562171 |
| 25 | 0.001089 | 0.381194 | 0.053912 | 0.001634 | 0.562171 |
| 26 | 0.001198 | 0.359353 | 0.079257 | 0.001797 | 0.558395 |
| 27 | 0.000881 | 0.422970 | 0.005434 | 0.001322 | 0.569393 |
| 28 | 0.000881 | 0.422970 | 0.005434 | 0.001322 | 0.569393 |
| 29 | 0.000894 | 0.420331 | 0.008496 | 0.001341 | 0.568937 |
| 30 | 0.000894 | 0.420331 | 0.008496 | 0.001341 | 0.568937 |
| Comparative example | | | | | |
| 1 | 0.000000 | 0.392857 | 0.035714 | 0.035714 | 0.535714 |
| 2 | 0.000858 | 0.427652 | 0.000000 | 0.001287 | 0.570203 |
| 3 | 0.004415 | 0.419426 | 0.005151 | 0.006623 | 0.564386 |
| 4 | 0.001478 | 0.421286 | 0.006652 | 0.002217 | 0.568367 |
| 5 | 0.000444 | 0.421941 | 0.007180 | 0.000666 | 0.569768 |

TABLE 3

Composition of Mixture and Burning Temperature

| | Composition of mixture (wt %) | | | | Burning temperature |
|---|---|---|---|---|---|
| | Si3N4 | AlN | Al2O3 | Eu2O3 | °C. |
| Embodiment | | | | | |
| 1 | 94.770 | 2.680 | 0.000 | 2.556 | 1900 |
| 2 | 97.460 | 1.300 | 0.000 | 1.241 | 1900 |
| 3 | 95.200 | 1.030 | 0.000 | 3.771 | 1900 |
| 4 | 97.370 | 1.350 | 0.000 | 1.286 | 1900 |
| 5 | 98.150 | 1.460 | 0.000 | 0.389 | 1900 |
| 6 | 90.390 | 2.050 | 0.000 | 7.559 | 1900 |
| 7 | 94.600 | 2.760 | 0.000 | 2.637 | 1900 |
| 8 | 96.170 | 3.030 | 0.000 | 0.804 | 1900 |
| 9 | 96.630 | 3.110 | 0.000 | 0.269 | 1900 |
| 10 | 80.690 | 4.130 | 0.000 | 15.183 | 1900 |
| 11 | 88.620 | 5.830 | 0.000 | 5.558 | 1900 |
| 12 | 91.770 | 6.500 | 0.000 | 1.727 | 1900 |
| 13 | 92.710 | 6.710 | 0.000 | 0.582 | 1900 |
| 14 | 90.670 | 2.410 | 5.990 | 0.931 | 2000 |
| 15 | 91.240 | 2.420 | 6.030 | 0.312 | 2000 |
| 16 | 82.300 | 4.810 | 11.960 | 0.929 | 2000 |
| 17 | 82.810 | 4.840 | 12.040 | 0.312 | 2000 |
| 18 | 82.980 | 4.850 | 12.060 | 0.104 | 2000 |
| 19 | 66.180 | 9.670 | 24.050 | 0.104 | 2000 |
| 20 | 96.170 | 3.030 | 0.000 | 0.804 | 1900 |
| 21 | 96.170 | 3.030 | 0.000 | 0.804 | 2000 |
| 22 | 92.480 | 6.650 | 0.000 | 0.870 | 1900 |
| 23 | 92.480 | 6.650 | 0.000 | 0.870 | 2000 |
| 24 | 88.130 | 10.930 | 0.000 | 0.948 | 1900 |
| 25 | 88.130 | 10.930 | 0.000 | 0.948 | 2000 |
| 26 | 82.930 | 16.030 | 0.000 | 1.040 | 1900 |
| 27 | 98.130 | 1.110 | 0.000 | 0.770 | 1900 |
| 28 | 98.130 | 1.110 | 0.000 | 0.770 | 2000 |
| 29 | 97.490 | 1.730 | 0.000 | 0.780 | 1900 |
| 30 | 97.490 | 1.730 | 0.000 | 0.780 | 2000 |
| Comparative example | | | | | |
| 1 | 91.521 | 2.431 | 6.048 | 0.000 | 2000 |
| 2 | 99.251 | 0.000 | 0.000 | 0.749 | 2000 |
| 3 | 95.200 | 1.030 | 0.000 | 3.771 | 1900 |
| 4 | 97.370 | 1.350 | 0.000 | 1.286 | 1900 |
| 5 | 98.150 | 1.460 | 0.000 | 0.389 | 1900 |

Embodiments 2 to 24

In order to obtain a composition shown in Table 2 using the same raw material powder as embodiment 1, the silicon nitride powder, the aluminum nitride powder and the europium oxide powder were weighed respectively so as to be specified quantities, and were mixed for 2 hours by a wet ball mill, using a pot made of silicon nitride sinter, balls made of silicon nitride sinter and n-hexane.

Dried mixture powder was obtained by removing n-hexane by means of a rotary evaporator. A powder aggregate being excellent in flowability was obtained by grinding the obtained mixture by means of an agate mortar and pestle and then passing the ground mixture through a sieve of 500 μm.

This powder aggregate was put into a crucible made of boron nitride of 20 mm in diameter and 20 mm in height by natural falling. Next, the crucible was set on an electric furnace of a graphite resistance heating type. A burning process first made a burning atmosphere vacuum by means of a diffusion pump, heated the crucible at a heating rate of 500° C./hour from room temperature to 800° C., introduced nitrogen of 99.999 vol % in purity at 800° C. to make 1 MPa in pressure, heated the crucible to 1900° C. or 2000° C. at a heating rate of 500° C./hour, and kept it at 1900° C. of 2000° C. for 2 hours.

The burnt materials obtained each contained a β-type $Si_3N_4$ or a β-type sialon of 50 wt % or more, and when a fluorescent spectrometry was performed, a fluorescent substance emitting a green light having a peak between 500 nm and 550 nm in wavelength by excitation of ultraviolet rays to visible light as shown in Table 3 was obtained. Optical characteristics of embodiments described above and comparative examples to be disclosed in the following are collectively shown in Table 4.

TABLE 4

Fluorescent Characteristics of Embodiments and Comparative Examples

| | Burning temperature °C. | Excitation wavelength (nm) | Wavelength of emitted light (nm) | Intensity, Arbitrary unit |
|---|---|---|---|---|
| Embodiment | | | | |
| 1 | 1900 | 303 | 535 | 3948 |
| 2 | 1900 | 300 | 525 | 648 |
| 3 | 1900 | 298 | 524 | 95 |
| 4 | 1900 | 299 | 525 | 428 |
| 5 | 1900 | 299 | 525 | 731 |
| 6 | 1900 | 300 | 526 | 279 |
| 7 | 1900 | 300 | 527 | 1437 |
| 8 | 1900 | 300 | 527 | 1861 |
| 9 | 1900 | 299 | 526 | 960 |
| 10 | 1900 | 299 | 527 | 292 |
| 11 | 1900 | 300 | 535 | 340 |
| 12 | 1900 | 300 | 528 | 1553 |
| 13 | 1900 | 298 | 528 | 1783 |
| 14 | 2000 | 466 | 538 | 302 |
| 15 | 2000 | 305 | 535 | 677 |
| 16 | 2000 | 467 | 544 | 1366 |
| 17 | 2000 | 308 | 543 | 1962 |
| 18 | 2000 | 306 | 542 | 1491 |
| 19 | 2000 | 405 | 546 | 1767 |
| 20 | 1900 | 301 | 534 | 3996 |
| 21 | 2000 | 307 | 535 | 6545 |
| 22 | 1900 | 303 | 535 | 4391 |
| 23 | 2000 | 304 | 530 | 4826 |
| 24 | 1900 | 303 | 529 | 2996 |
| 25 | 2000 | 305 | 528 | 4248 |
| 26 | 1900 | 302 | 529 | 3544 |
| 27 | 1900 | 302 | 526 | 2812 |
| 28 | 2000 | 302 | 527 | 2079 |
| 29 | 1900 | 302 | 528 | 5215 |
| 30 | 2000 | 301 | 528 | 4183 |
| Comparative example | | | | |
| 1 | 2000 | | | |
| 2 | 2000 | 344 | 592 | 285 |
| 3 | 1800 | 266 | 415 | 1271 |
| 4 | 1800 | 268 | 414 | 2024 |
| 5 | 1800 | 268 | 414 | 2318 |

Inorganic compound powder was made by a similar method to embodiments 2 to 24, except compositions and burning temperatures shown in Tables 2, 3.

Comparative example 1 has a composition close to embodiment 14 but does not contain Eu. An inorganic compound obtained by burning at 2000° C. for 2 hours was a β-sialon of z=0.5 but did not emit light at all even by being excited by a light of 200 nm to 500 nm due to containing no Eu.

Figure 6:
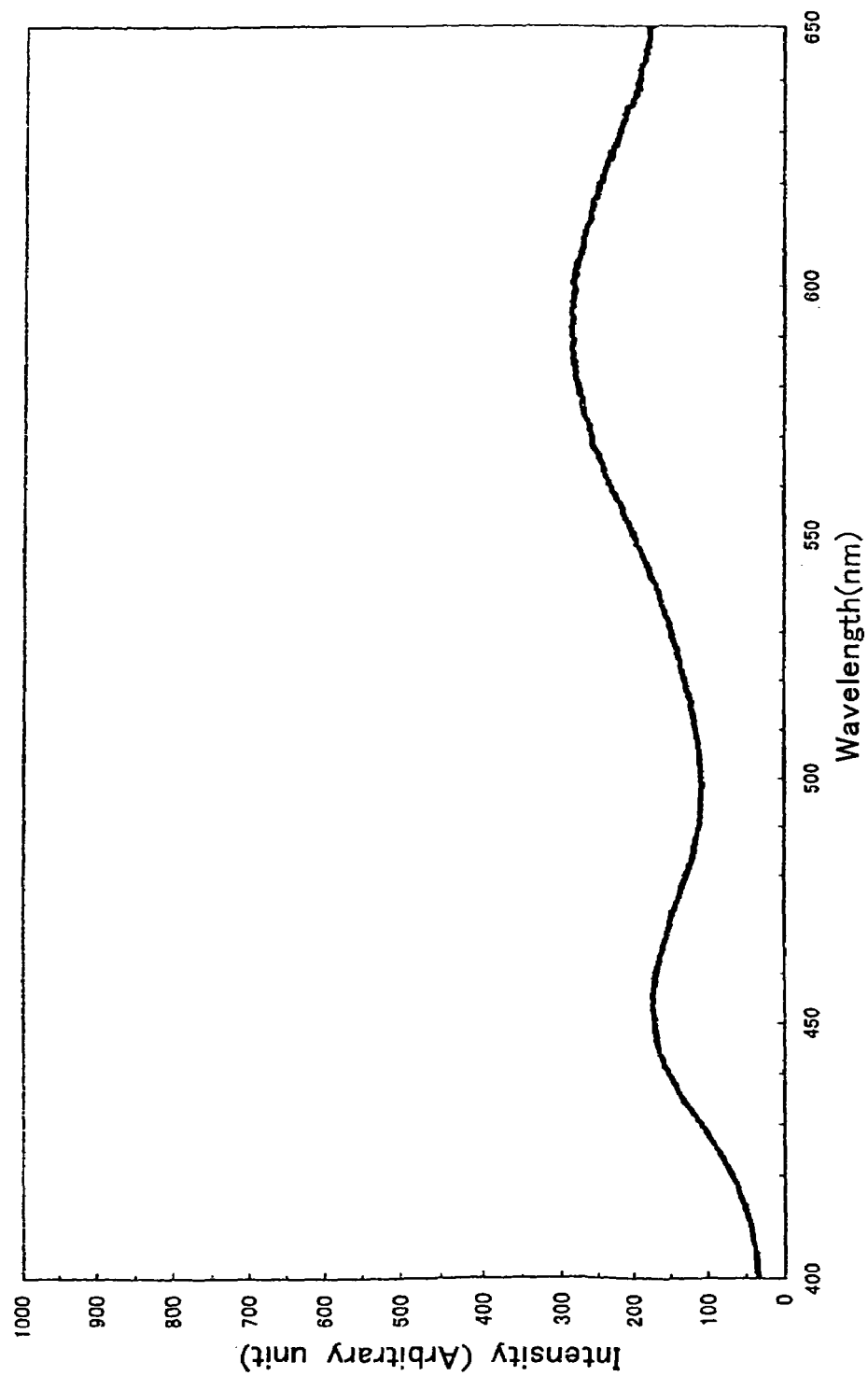
FIG. 6 shows an emitted light spectrum of comparative example 2.

Comparative example 2 has a composition close to embodiment 20 but does not contain Al. An inorganic compound obtained by burning at 2000° C. for 2 hours was a β-type $Si_3N_4$ but did not emit a green light as shown in FIG. 6 since Eu remained in a grain boundary glass phase without being solid-dissolved into grains under this condition.

Figure 7:
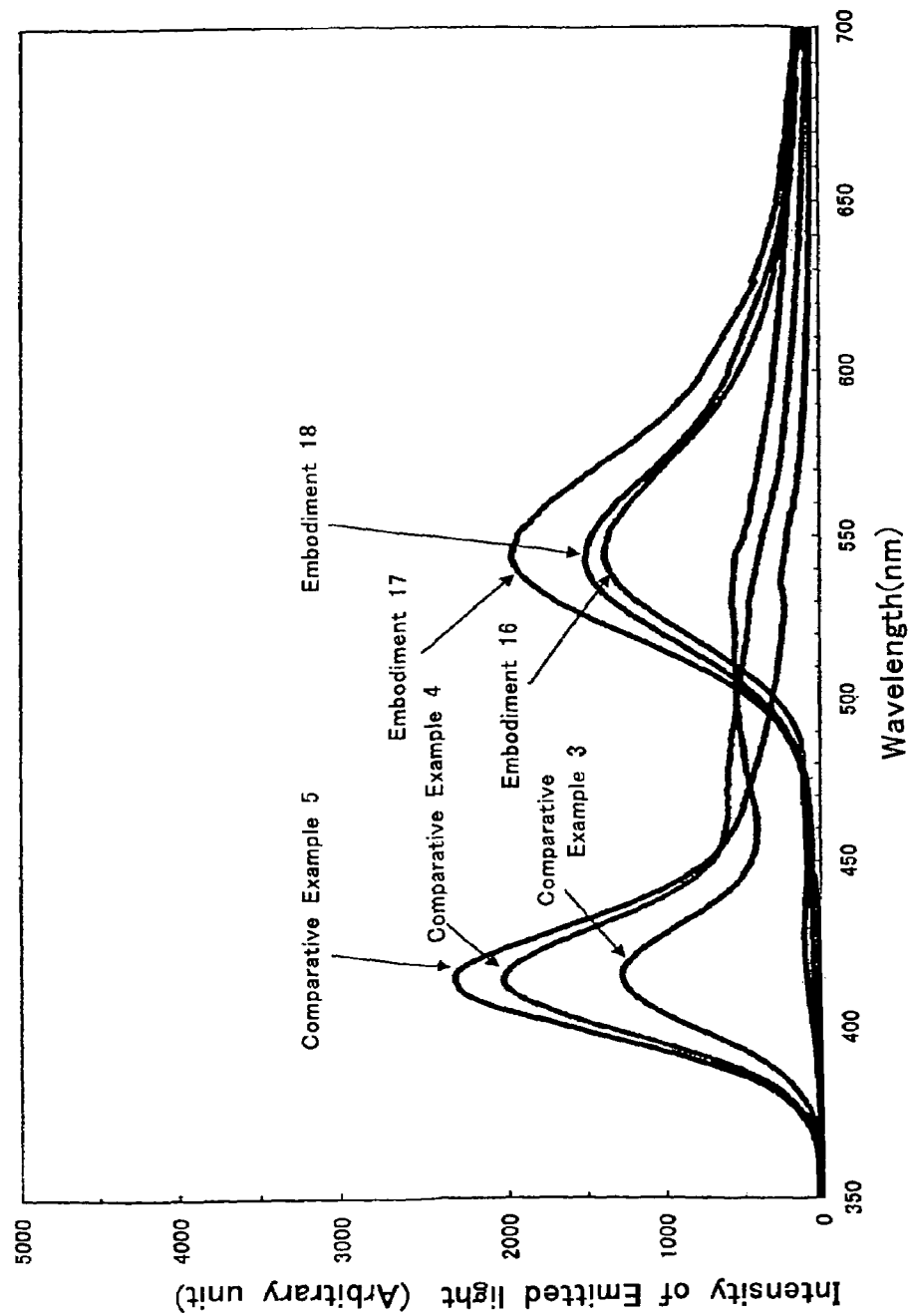
FIG. 7 shows emitted light spectra of comparative examples 3 to 5.

Comparative examples 3 to 5 have the same compositions as embodiments 16 to 18 respectively, but are lower in burning temperature. An inorganic compound obtained by burning at 1800° C. for 2 hours was a β-sialon of z=1, but most of Eu remained as a grain boundary without being solid-dissolved into grains due to its low burning temperature and therefore when being excited by ultraviolet rays it emitted a blue light as shown in FIG. 7 and did not emit a green light.

Comparative Example 6

In order to synthesize a β-sialon of z=3 containing Eu in composition $Si_3Al_{2.97}Eu_{0.03}O_{8.03}N_{4.97}$, $Si_3N_4$ powder of 48.828 wt %, AlN powder of 13.84 wt %, $Al_2O_3$ powder of 35.49 wt % and $Eu_2O_3$ powder of 1.84 wt % were weighed, and mixed powder was made on the basis of the same method and procedure as embodiment 1. This was burned at 1550° C. for 3 hours in a nitrogen atmosphere of 1 atm., being a burning condition described in embodiment 23 of patent literature 5 using the same burning furnace as embodiment 1.

Figure 8:
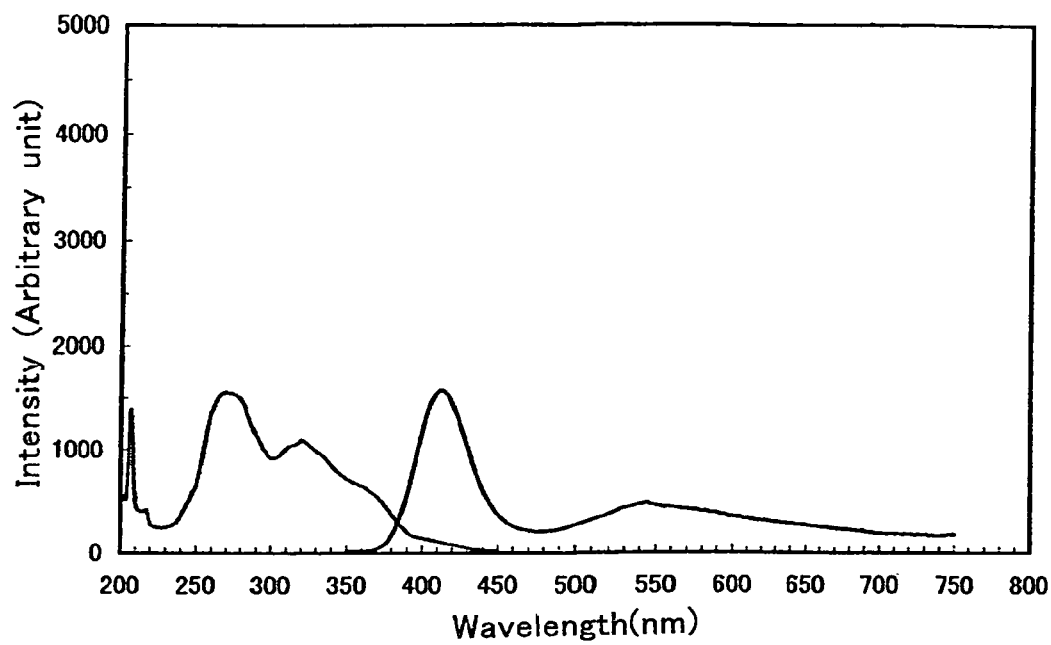
FIG. 8 shows an emitted light spectrum of comparative example 6.

When the spectrum of light emitted by excitation of the obtained powder was measured, a violet light of 410 nm in wavelength was emitted as shown in FIG. 8 and was different from a green light emitted in the present invention.

Embodiment 31

Powder having the same composition as embodiment 1 was mixed for 2 hours by a wet ball mill using a pot made of silicon nitride sinter, balls made of silicon nitride sinter and n-hexane. Dried mixture powder was obtained by removing n-hexane by means of a rotary evaporator. A powder aggregate being excellent in flowability was obtained by grinding the obtained mixture by means of an agate mortar and pestle and then passing the ground mixture through a sieve of 500 µm, and this powder aggregate was put into a crucible made of boron nitride. Next, the crucible was set on an electric furnace of a graphite resistance heating type. A burning process first made a burning atmosphere vacuum by means a diffusion pump, heated the crucible at a heating rate of 500° C./hour from room temperature to 800° C., introduced nitrogen of 99.999 vol % in purity at 800° C. to make 1 MPa in pressure, heated the crucible to 2000° C. at a heating rate of 500° C./hour, kept it at 2000° C. for 8 hours and then performed a heat treatment on it at 1700° C. for 24 hours.

The burnt material obtained was slightly ground by means of an agate mortar made of silicon nitride and then its powder of about 5 g was put into a beaker made of Teflon and had distilled water of 380 ml, hydrofluoric acid (made by WAKO-JUNYAKU Co., Special Grade, 46% in concentration) of 10 ml and sulfuric acid (made by WAKOJUNYAKU Co., Special Grade, 95% in concentration) of 10 ml added to it, and was stirred and mixed by a magnetic stirrer for 2 hours. After this, the acids were removed by cleaning with distilled water.

Figure 9:
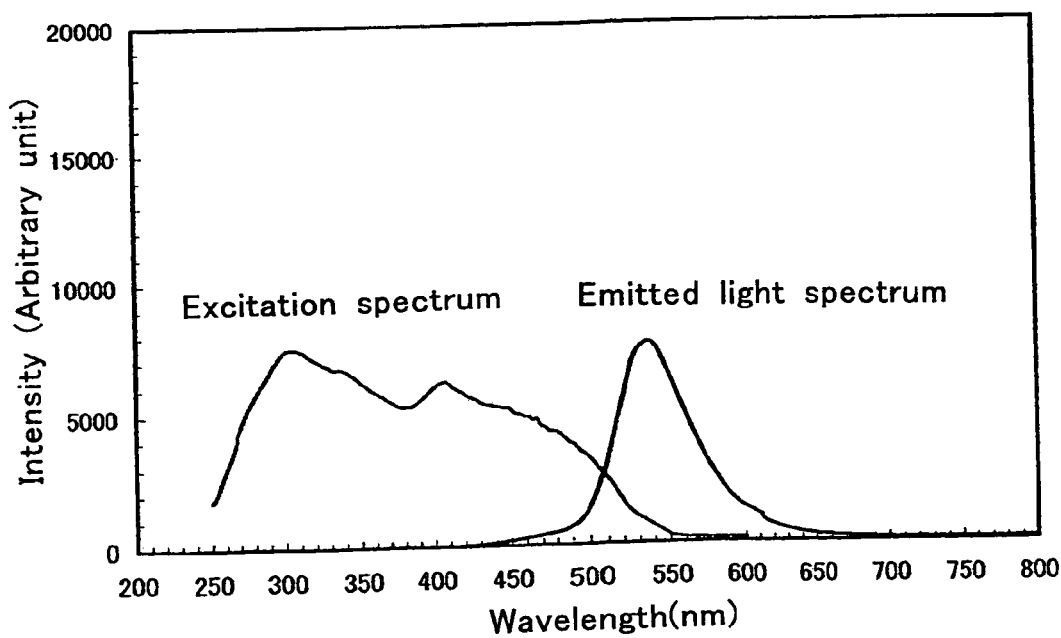
FIG. 9 shows an emitted light spectrum of embodiment 31 before an acid treatment.
Figure 10:
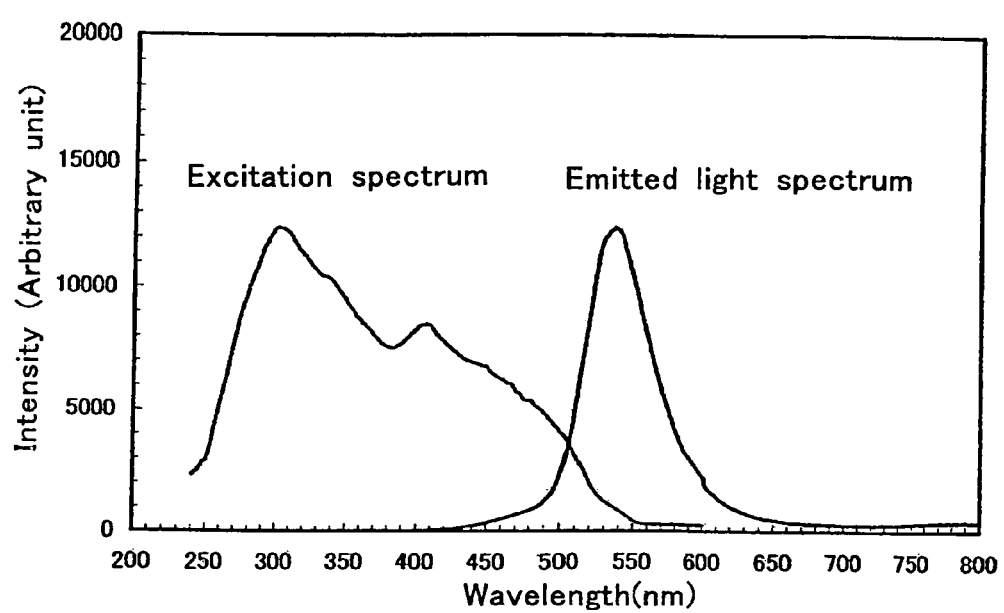
FIG. 10 shows an emitted light spectrum of comparative example 31 after an acid treatment.

The spectra of light emitted by excitation before and after an acid treatment are shown in FIGS. 9 and 10. A green fluorescent substance of high luminance was obtained by this process. A fluorescent substance after acid treatment has the intensity of emitted light exceeding a green fluorescent substance of YAG:Ce on the market. When this powder was observed by means of a scanning electron microscope, powder of spherical grains each being about 3 µm in grain diameter and having an aspect ratio close to 1 was obtained. Further, when the powder was observed by means of a high-resolution transmission electron microscope, it has been confirmed that plane defects exist in a crystal and Eu exists in the defective parts.

Next, an illuminator using a fluorescent substance made of nitride of the present invention is described.

Figure 11:
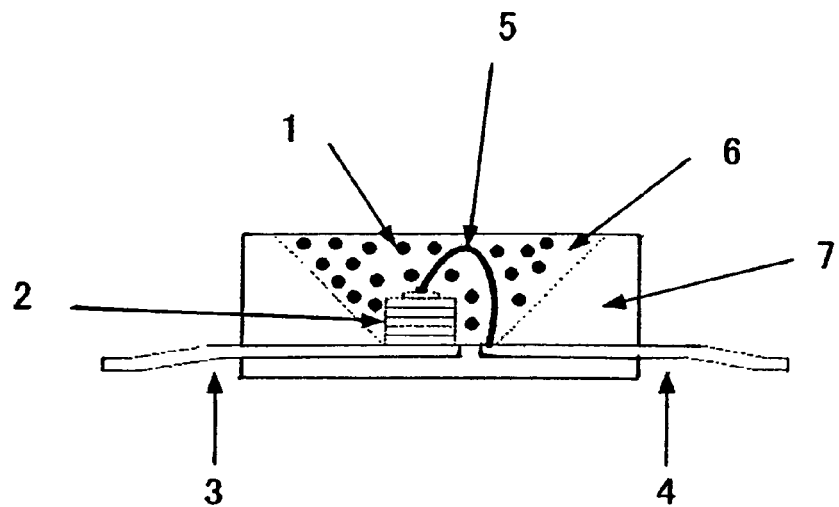
FIG. 11 is a schematic diagram of an illuminator (LED illuminator) according to the present invention.

FIG. 11 is a schematic structural diagram of a white LED as an illuminator.

This has a structure in which a blue LED 2 of 460 nm is used as a light emitting device and the blue LED 2 is covered with a resin layer in which a fluorescent substance of embodiment 1 of the present invention and a yellow fluorescent substance of Ca-α-sialon:Eu having composition $Ca_{0.75}Eu_{0.25}Si_{8.625}Al_{3.375}O_{1.125}N_{14.875}$ are dispersed.

When an electric current is made to flow through conductive terminals, the LED 2 emits a light of 460 nm, and the yellow fluorescent substance and a green fluorescent substance are excited by this light to emit yellow and green lights respectively, and thus this illuminator functions as an illuminator emitting a white light obtained by mixing the LED light with the yellow and green lights. This illuminator was high in color rendering ability due to having a green component in comparison with the case of singly using a yellow fluorescent substance.

An illuminator made by a different composition design from the above composition is shown. This has a structure in which a blue LED of 460 nm is first used as a light emitting device and an ultraviolet LED is covered with a resin layer in which a fluorescent substance of embodiment 1 of the present invention and a red fluorescent substance ($CaSiAlN_3$:Eu) are dispersed. When an electric current was made to flow through conductive terminals, the LED emitted a light of 460 nm, and the red fluorescent substance and a green fluorescent substance were excited by this light to emit red and green lights. This illuminator was able to function as an illuminator emitting a white light obtained by mixing a blue light emitted by the LED itself with the lights from these fluorescent substances.

Further, an illuminator made by a different composition design from the above composition is shown.

This has a structure in which an ultraviolet LED of 380 nm is first used as a light emitting device and the ultraviolet LED is covered with a resin layer in which a fluorescent substance of embodiment 1 of the present invention, a blue fluorescent substance ($BaMgAl_{10}O_{17}$:Eu) and a red fluorescent substance ($CaSiAlN_3$:Eu) are dispersed. When an electric current is made to flow through conductive terminals, the LED emits a light of 380 nm, and the red fluorescent substance, the green fluorescent substance and the blue fluorescent substance are excited by this light to emit red, green and blue lights, respectively. This illuminator was able to function as an illuminator emitting a white light obtained by mixing these lights.

Next, a design example of an image display device using a nitride fluorescent substance of the present invention is described.

Figure 12:
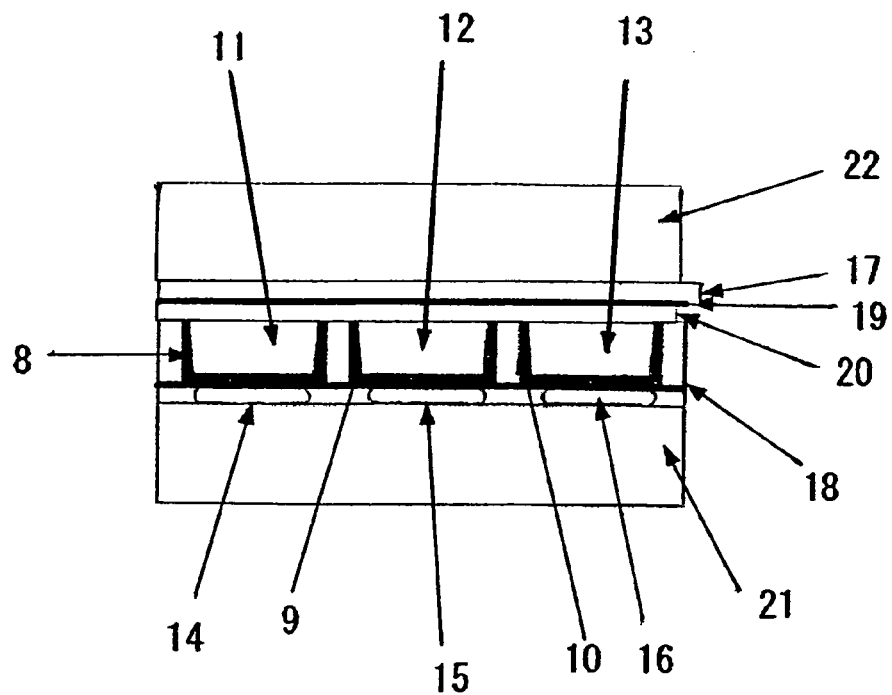
FIG. 12 is a schematic diagram of an image display device (plasma display panel) according to the present invention.

FIG. 12 is a fundamental schematic diagram of a plasma display panel as an image display device. A green fluorescent substance of embodiment 1 of the present invention, a red fluorescent substance ($Y(PV)O_4$:Eu) and a blue fluorescent substance ($BaMgAl_{10}O_{17}$:Eu) are respectively applied to the inner faces of cells 11, 12 and 13.

When an electric current is made to flow through electrodes 14, 15, 16 and 17, vacuum ultraviolet rays are generated by Xe-discharge in the cells and the fluorescent substances are excited by this and emit visible lights of red, green and blue, and these lights are observed from the outside through a protective layer 20, a dielectric layer 19 and a glass substrate 22; and thus this image display device has been found to be able to function as an image display.

INDUSTRIAL APPLICABILITY

A nitride fluorescent substance of the present invention is a nitride fluorescent substance to be used preferably in VFD, FED, PDP, CRT, white LED and the like, since it emits a green light differently from a conventional sialon fluorescent substance and oxy-nitride fluorescent substance, and further is less in reduction of luminance of the fluorescent substance in case of being exposed to an excitation source. After this, it can be expected that this fluorescent substance is greatly utilized in material design for various display devices and contributes to development of industry.

What I claim is:

1. A fluorescent substance comprising a crystal of nitride or oxy-nitride having a β-type $Si_3N_4$ crystal structure having $Eu^{+2}$ solid-dissolved into it and emitting a fluorescent light having a peak within a range of 500 nm to 600 nm in wavelength by being irradiated with an excitation source.

2. A fluorescent substance according to claim 1, wherein said crystal having a β-type $Si_3N_4$ crystal structure comprises a β-type sialon ($Si_{6-z}Al_zO_zN_{8-z}$, where $0 \leq z \leq 4.2$).

3. A fluorescent substance according to claim 2, wherein the value of said z is $0 \leq z \leq 0.5$.

4. A fluorescent substance according to claim 1, wherein in case of representing Eu, A (where A is one, two or more kinds of elements selected from C, Si, Ge, Sn, B, Al, Ga and In) and X (where X is one or two kinds of elements selected from O and N) which are contained in said nitride or oxy-nitride crystal with a composition formula $Eu_aA_bX_c$ (where a+b+c=1), a, b and c in this formula meet the following relations (i) to (iii):

$$0.00001 \leq a \leq 0.1 \quad \text{(i)}$$

$$0.38 \leq b \leq 0.46 \quad \text{(ii)}$$

$$0.54 \leq c \leq 0.62 \quad \text{(iii)}.$$

5. A fluorescent substance according to claim 1, wherein in case of representing said nitride or oxy-nitride crystal with a composition formula $Eu_aSi_{b1}Al_{b2}O_{c1}N_{c2}$ (where $a+b_1+b_2+c_1+c_2=1$), a, $b_1$, $b_2$, $c_1$ and $c_2$ in this formula meet the following relations (i) to (v):

$$0.00001 \leq a \leq 0.1 \quad \text{(i)}$$

$$0.28 \leq b_1 \leq 0.46 \quad \text{(ii)}$$

$$0.001 \leq b_2 \leq 0.3 \quad \text{(iii)}$$

$$0.001 \leq c_1 \leq 0.3 \quad \text{(iv)}$$

$$0.4 \leq c_2 \leq 0.62 \quad \text{(v)}.$$

6. A fluorescent substance according to claim 5, wherein in said composition formula $Eu_aSi_{b1}Al_{b2}O_{c1}N_{c2}$, the relation between $b_1$ and $b_2$ and the relation between $c_1$ and $c_2$ respectively meet the following relations:

$$0.41 \leq b_1+b_2 \leq 0.44, \text{ and}$$

$$0.56 \leq c_1+c_2 \leq 0.59.$$

7. A fluorescent substance according to claim 1, wherein said excitation source is an ultraviolet light or a visible light of 100 nm to 500 nm in wavelength.

8. A fluorescent substance according to claim 7, wherein said excitation source is a violet light or a blue light of 400 nm to 500 nm in wavelength.

9. A fluorescent substance according to claim 1, wherein said excitation source is an electron beam or an X ray.

10. A fluorescent substance according to claim 1, wherein said peak is within a range of 500 nm to 550 nm in wavelength.

11. A fluorescent substance according to claim 1, wherein x and y of a value (x, y) on a CIE chromaticity coordinates of a color of light emitted at a time of being irradiated with said excitation source meet the following relations (i) and (ii):

$$0 \leq x \leq 0.3 \qquad (i)$$

$$0.5 \leq y \leq 0.83 \qquad (ii).$$

12. A fluorescent substance according to claim 1, wherein said nitride or oxy-nitride crystal comprises a single crystal of 50 nm to 20 µm in average grain diameter.

13. A fluorescent substance according to claim 1, wherein said nitride or oxy-nitride crystal is a single crystal of 1.5 to 20 in average aspect ratio.

14. A fluorescent substance according to claim 1, wherein a total of impurity elements Fe, Co and Ni contained in said nitride or oxy-nitride crystal is not more than 500 ppm.

* * * * *